(12) United States Patent
Obata et al.

(10) Patent No.: US 12,336,116 B2
(45) Date of Patent: Jun. 17, 2025

(54) COMPOSITE COPPER COMPONENTS

(71) Applicant: NAMICS CORPORATION, Niigata (JP)

(72) Inventors: Naoki Obata, Niigata (JP); Yoshinobu Kokaji, Niigata (JP); Makiko Sato, Niigata (JP)

(73) Assignee: NAMICS CORPORATION, Niigata (JP)

( * ) Notice: Subject to any disclaimer, the term of this patent is extended or adjusted under 35 U.S.C. 154(b) by 441 days.

(21) Appl. No.: 17/771,101

(22) PCT Filed: Oct. 22, 2020

(86) PCT No.: PCT/JP2020/039789
§ 371 (c)(1),
(2) Date: Nov. 10, 2022

(87) PCT Pub. No.: WO2021/079952
PCT Pub. Date: Apr. 29, 2021

(65) Prior Publication Data
US 2023/0142375 A1    May 11, 2023

(30) Foreign Application Priority Data
Oct. 25, 2019  (JP) .................................. 2019-194444

(51) Int. Cl.
*H05K 1/09* (2006.01)
*H05K 3/38* (2006.01)

(52) U.S. Cl.
CPC ............... *H05K 3/385* (2013.01); *H05K 1/09* (2013.01); *H05K 3/384* (2013.01); *H05K 3/389* (2013.01);
(Continued)

(58) Field of Classification Search
CPC .......... H05K 3/385; H05K 1/09; H05K 3/384; H05K 3/389; H05K 2201/0355;
(Continued)

(56) References Cited

U.S. PATENT DOCUMENTS

2012/0125514 A1   5/2012  Wei et al.
2017/0347449 A1*  11/2017  Sugiura .................... H05K 3/24
(Continued)

FOREIGN PATENT DOCUMENTS

JP    S-63-168077 A    7/1988
JP    H-1-297883 A    11/1989
(Continued)

OTHER PUBLICATIONS

Extended European Search Report for European Patent Application No. 20878385.2, dated Apr. 8, 2024 (8 pages).

*Primary Examiner* — Timothy J Thompson
*Assistant Examiner* — Michael F McAllister
(74) *Attorney, Agent, or Firm* — Clark & Elbing LLP

(57) ABSTRACT

The present invention is directed to provide novel composite copper components. For example, provided is a composite copper component including a copper oxide-containing layer formed on at least a portion of the surface of a copper component, in which when the surface of the composite copper component is bonded to a resin substrate by thermocompression, and the copper component is peeled off from the resin substrate after the thermocompression bonding, metal contained in the copper oxide-containing layer is transferred to the resin substrate.

15 Claims, 19 Drawing Sheets

(52) U.S. Cl.
CPC .............. *H05K 2201/0355* (2013.01); *H05K 2203/0315* (2013.01); *H05K 2203/0796* (2013.01); *H05K 2203/124* (2013.01)

(58) Field of Classification Search
CPC ... H05K 2203/0315; H05K 2203/0796; H05K 2203/124
USPC .......................................................... 174/259
See application file for complete search history.

(56) References Cited

U.S. PATENT DOCUMENTS

| | | | | |
|---|---|---|---|---|
| 2018/0210337 | A1* | 7/2018 | Wakita | H01L 21/4853 |
| 2020/0245458 | A1* | 7/2020 | Miyata | H05K 3/388 |
| 2020/0332431 | A1 | 10/2020 | Sato et al. | |
| 2021/0328325 | A1* | 10/2021 | Komiya | H05K 1/09 |
| 2022/0087032 | A1* | 3/2022 | Kitai | C25D 7/0614 |
| 2022/0106426 | A1* | 4/2022 | Kitai | C25D 1/04 |
| 2022/0204696 | A1* | 6/2022 | Mizori | C25D 7/00 |
| 2022/0225498 | A1* | 7/2022 | Yuasa | B23K 35/3601 |

FOREIGN PATENT DOCUMENTS

| | | |
|---|---|---|
| JP | H-4-304382 A | 10/1992 |
| JP | H-6-173015 A | 6/1994 |
| JP | H-08-97559 A | 4/1996 |
| JP | 2013-534054 A | 8/2013 |
| JP | 2015-200026 A | 11/2015 |
| JP | 2016-188431 A | 11/2016 |
| JP | 2017-34216 A | 2/2017 |
| KR | 10-2016-0095178 A | 8/2016 |
| KR | 10-2016-0109731 A | 9/2016 |
| WO | WO-2012/005723 A1 | 1/2012 |
| WO | WO-2014/126193 A1 | 8/2014 |
| WO | WO-2019/093494 A1 | 5/2019 |
| WO | WO-2021/172096 A1 | 9/2021 |

\* cited by examiner

FIG.2-1

|  | EXAMPLE | | | | | | | | COM. EXAM. | | |
|---|---|---|---|---|---|---|---|---|---|---|---|
|  | 1 | 2 | 3 | 4 | 5 | 6 | 7 | 8 | 2 | 3 | 4 |
| R5670KJ | ○ | ○ | ○ | ○ | ○ | ○ | ○ | ○ | × | × | × |
| R5680J | ○ | ○ | ○ | ○ | ○ | ○ | ○ | ○ | × | × | × |
| CT-Z | ○ | ○ | ○ | ○ | ○ | ○ | ○ | ○ | × | × | × |
| NX9255 | ○ | ○ | ○ | ○ | ○ | ○ | ○ | ○ | × | × | × |
| R1551GG | ○ | ○ | ○ | ○ | ○ | ○ | ○ | ○ | × | × | × |

COM. EXAM. = COMPARATIVE EXAMPLE

COMPOSITE COPPER COMPONENTS

CROSS-REFERENCE TO RELATED DOCUMENTS

The present application claims priority to Japanese patent application No. 2019-194444, filed on Oct. 25, 2019, which is hereby incorporated by reference.

TECHNICAL FIELD

The present invention relates to composite copper components.

BACKGROUND ART

Copper foils used for printed wiring boards are required to have adhesive ability to an insulating resin substrate. To enhance their adhesive ability, a method of roughening the surface of copper foils by etching has bee used to increase the mechanical adhesion strength via a so-called anchor effect. The planarization of the copper foil surface, on the other hand, has come to be required to increase the density of printed wiring boards and reduce transmission loss in high-frequency bands. To meet these contradictory demands, a method for treating copper surfaces involving oxidation and reduction was developed (WO2014/126193). In this method, a copper foil is pre-conditioned and immersed in a chemical solution containing an oxidizing agent, thereby oxidizing the surface of the copper foil to form protrusions of copper oxide, and then immersed in a chemical solution containing a reducing agent, thereby reducing the copper oxide to adjust the protrusions and tune the roughness of the surface. As other methods for improving adhesive ability in treatment of copper foils using oxidation and reduction, methods of adding surface active molecules in the oxidation process (JP-T-2013-534054) and of forming a protective film on the surface of a copper foil using an aminothiazole compound or the other after the reduction process (JP-A-8-97559) have been developed.

It was known that the longer and the more protrusions formed using the roughening process are, the stronger the mechanical adhesive strength between the copper foil and the resin is; however, simultaneously, owing to the shortage of strength of the protrusions, there was an issue that the protrusions tend to fall off from the root or break at the middle. It was reported to plate the surface of the protrusions to increase their strength (JP-A-2016-188431).

The present inventors also developed composite copper foils obtained by electrolytically plating nickel (Ni) on a roughened copper foil (WO2019/093494).

Because of the recent trend toward finer wiring in circuit-forming methods for printed wiring boards and semiconductor package substrates, new processes such as the semi-additive process (SAP) and modified semi-additive process (MSAP) which use the surface profile of copper foils have gained attention (JP-A-2017-034216).

The following approach is an example of the SAP using the surface profile of copper foils (i.e., a surface topology with protrusions formed by roughening treatment). First, the entire surface of a copper foil laminated on a resin substrate is subjected to etching. A hole is formed in the etched surface of the substrate on which the surface profile of the copper foil was imprinted using, for example, a laser, and electroless copper plating is performed to conduct the hole-formed area. A dry film is applied to the electroless copper-plated surface, and then the dry film is removed from a portion where a circuit is to be formed, using UV exposure and development. The portion of the electroless copper-plated surface that is not covered with the dry film is electroplated with copper. The dry film is then peeled off, and finally the electroless copper plating layer is subjected to etching (flash etching or quick etching) using a solution such as an etching solution containing sulfuric acid or hydrogen peroxide to form a fine circuit.

The surface profile of the copper foil must be imprinted onto the resin substrate in this process by laminating the resin substrate to the surface-treated copper foil and peeling the surface-treated copper foil off. Some resources to maintain the strength of the protrusions of the copper foil surface have become even more necessary because the surface profile must be imprinted well onto the surface of the resin substrate without damaging the profile on the surface of the copper foil.

SUMMARY OF THE INVENTION

Problems to be Solved by the Invention

In conventional processes using the surface profile of copper foils, for example, a copper foil with roughened grains is laminated to a resin substrate with its surface having the roughened grains facing toward the substrate and then the copper foil is removed, whereby the profile on the copper foil surface is imprinted onto the resin substrate surface, and the surface with the imprint is plated with copper. However, the plating solution may not be able to spread into surfaces with intricate concavities and convexities. In such a case, a void is created between the resin substrate and the (patterned) copper plating layer. When heated, the void is enlarged, resulting in problems such as circuit delamination or substrate blistering.

Thus, it is an object of the present invention to provide composite copper components suitable for SAPs and MSAPs.

Means to Solve the Problem

As a result of extensive research, the present inventors have found that it is possible to fabricate composite copper components suitable for SAPs and MSAPs by reducing the strength of protrusions produced using the roughening process rather than increasing the strength.

The present invention includes the following aspects.

[1]

A composite copper component including a copper oxide-containing layer formed on at least a portion of the surface of a copper component, wherein
when the surface of the composite copper component is bonded to a resin substrate by thermocompression under given conditions, the copper component is peeled off from the resin substrate under given conditions after the thermocompression bonding, and a surface of the copper component peeled off from the resin substrate is analyzed using attenuated total reflection Fourier transform infrared spectroscopy (ATR FT-IR), a signal-to-noise (S/N) ratio of a peak corresponding to a detected substance derived from the resin substrate is 10 or less in a wavelength range of 700-4000 $cm^{-1}$.

[2]

The composite copper component according to [1], wherein the peak has a signal-to-noise ratio of 7 or less.

[3]
A composite copper component including a copper oxide-containing layer formed on at least a portion of the surface of a copper component, wherein
when the surface of the composite copper component is bonded to a resin substrate by thermocompression under given conditions, and the copper component is peeled off from the resin substrate under given conditions after the thermocompression bonding, a metal atom contained in the copper oxide-containing layer is detected from a surface of the resin substrate from which the copper component has been peeled off in an X-ray photoelectron spectrum obtained by an X-ray photoelectron spectroscopy (XPS) analysis with a survey spectrum.

[4]
The composite copper component according to [3], wherein a sum of intensities of main peaks of metal elements detected from the surface of the resin substrate from which the copper component has been peeled off is greater than a peak intensity of C1s.

[5]
The composite copper component according to [4], wherein [a sum of percentages of metal elements in surface atomic composition (atom %)] divided by [a percentage of C1s in surface atomic composition (atom %)], calculated from a result of XPS measurement, on the surface of the resin substrate from which the copper component has been peeled off, is 0.040 or more.

[6]
The composite copper component according to [4], wherein [a sum of percentages of metal elements in surface atomic composition (atom %)] divided by [a percentage of C1s in surface atomic composition (atom %)], calculated from a result of XPS measurement, on the surface of the resin substrate from which the copper component has been peeled off, is 0.010 or more.

[7]
The composite copper component according to [4], wherein a sum of percentages of Cu2p3 and Ni2p3 in surface atomic composition is 3.0 atom % or more when an XPS analysis with a survey spectrum is performed on the surface of the resin substrate from which the copper component has been peeled off, and percentages of detected elements are calculated.

[8]
The composite copper component according to [4], wherein a sum of percentages of Cu2p3 and Ni2p3 in surface atomic composition is 1.5 atom % or more when an XPS analysis with a survey spectrum is performed on the surface of the resin substrate from which the copper component has been peeled off, and percentages of detected elements are calculated.

[9]
The composite copper component according to [4], wherein a percentage of Cu2p3 in surface atomic composition is 2.8 atom % or more when an XPS analysis with a survey spectrum is performed on the surface of the resin substrate from which the copper component has been peeled off, and percentages of detected elements are calculated.

[10]
The composite copper component according to [4], wherein a percentage of Cu2p3 in surface atomic composition is 1.0 atom % or more when an XPS analysis with a survey spectrum is performed on the surface of the resin substrate from which the copper component has been peeled off, and percentages of detected elements are calculated.

[11]
The composite copper component according to any one of [1] to [10], wherein the surface of the composite copper component with the copper oxide-containing layer formed thereon has an arithmetic mean roughness (Ra) of 0.04 μm or more, and a percentage of Ra of the surface of the copper component peeled off from the resin substrate to the Ra of the surface of the composite copper component is less than 100%.

[12]
The composite copper component according to any one of [1] to [11], wherein a percentage of a surface area of the copper component peeled off from the resin substrate to a surface area of the surface of the composite copper component with the copper oxide-containing layer formed thereon is less than 100%.

[13]
The composite copper component according to any one of [1] to [12], wherein a color difference ($\Delta E^*_{ab}$) between the surface of the composite copper component with the copper oxide-containing layer formed thereon and the surface of the copper component peeled off from the resin substrate is 15 or more.

[14]
The composite copper component according to any one of [1] to [13], wherein the resin substrate contains at least one insulating resin selected from the group consisting of polyphenylene ethers (PPEs), epoxy resins, polyphenylene oxides (PPOs), polybenzoxazoles (PBOs), polytetrafluoroethylenes (PTFEs), liquid crystal polymers (LCPs), or triphenylphosphites (TPPIs), fluoropolymers, polyetherimides, polyetheretherketones, polycycloolefins, bismaleimide resins, low dielectric constant polyimides, and cyanate resins.

[15]
The composite copper component according to any one of [1] to [14], wherein given conditions for the thermocompression bonding are at a temperature of 50° C.-400° C., at a pressure of 0-20 MPa, and for a time from 1 minute to 5 hours.

[16]
The composite copper component according to any one of [1] to [15], wherein the copper oxide-containing layer contains metal other than copper.

[17]
The composite copper component according to [16], wherein the metal other than copper is nickel.

[18]
A method of manufacturing a printed wiring board using a composite copper component according to any one of [1] to [17], the method including the steps of:
1) bonding a resin substrate to a copper oxide-containing layer of the composite copper component under given conditions by thermocompression;
2) peeling off the copper component from the resin substrate under given conditions to obtain a resin substrate having a part or all of metal constituting the copper oxide-containing layer; and
3) plating copper on the surface of the resin substrate having a part or all of metal constituting the copper oxide-containing layer.

[1A]
A method of manufacturing a resin substrate having metal, the method including the steps of:
1) bonding a resin substrate to a copper oxide-containing layer of a composite copper component under given conditions by thermocompression, the copper oxide-containing layer being formed on at least a portion of the surface of a copper component; and 2) peeling off the copper component from the resin substrate under given conditions to obtain a resin substrate having a part or all of metal constituting the copper oxide-containing layer.

[2A]

The method according to [1A], wherein a metal atom contained in the copper oxide-containing layer is detected by an X-ray photoelectron spectroscopy (XPS) analysis with a survey spectrum for the resin substrate having the metal.

[3A]

The method according to [2A], wherein a sum of intensities of main peaks of detected metal elements is greater than a peak intensity of C1s in a spectrum.

[4A]

The method according to [3A], wherein [a sum of percentages of metal elements in surface atomic composition (atom %)] divided by [a percentage of C1s in surface atomic composition (atom %)], calculated from measurement by the XPS is 0.040 or more.

[5A]

The method according to [3A], wherein [a sum of percentages of metal elements in surface atomic composition (atom %)] divided by [a percentage of C1s in surface atomic composition (atom %)], calculated from measurement by the XPS is 0.010 or more.

[6A]

The method according to [3A], wherein a sum of percentages of Cu2p3 and Ni2p3 in surface atomic composition is 3.0 atom % or more when an XPS analysis with a survey spectrum is performed on the surface of the resin substrate from which the copper component has been peeled off, and percentages of detected elements are calculated.

[7A]

The method according to [3A], wherein a sum of percentages of Cu2p3 and Ni2p3 in surface atomic composition is 1.5 atom % or more when an XPS analysis with a survey spectrum is performed on the surface of the resin substrate from which the copper component has been peeled off, and percentages of detected elements are calculated.

[8A]

The method according to [3A], wherein a percentage of Cu2p3 in surface atomic composition is 2.8 atom % or more when an XPS analysis with a survey spectrum is performed on the surface of the resin substrate from which the copper component has been peeled off, and percentages of detected elements are calculated.

[9A]

The method according to [3A], wherein a percentage of Cu2p3 in surface atomic composition is 1.0 atom % or more when an XPS analysis with a survey spectrum is performed on the surface of the resin substrate from which the copper component has been peeled off, and percentages of detected elements are calculated.

[10A]

The method according to any one of [1A] to [9A], wherein the resin substrate includes at least one insulating resin selected from polyphenylene ethers (PPEs), epoxy resins, polyphenylene oxides (PPOs), polybenzoxazoles (PBOs), polytetrafluoroethylenes (PTFEs), liquid crystal polymers (LCPs), triphenylphosphites (TPPIs), fluoropolymers, polyetherimides, polyetheretherketones, polycycloolefins, bismaleimide resins, low dielectric constant polyimides, and cyanate resins.

[1B]

A method of manufacturing a laminate including a composite copper component and a resin substrate, the composite copper component including a copper oxide-containing layer formed on at least a portion of the surface of a copper component, the method including the step of:
bonding the resin substrate to the copper oxide-containing layer under given conditions by thermocompression, wherein
when the copper component is peeled off from the resin substrate under given conditions, a metal atom contained in the copper oxide-containing layer is detected from a surface of the resin substrate from which the copper component has been peeled off, by measurement using an X-ray photoelectron spectroscopy (XPS).

[2B]

A method of manufacturing a laminate including a composite copper component and a resin substrate, the composite copper component including a copper oxide-containing layer formed on at least a portion of the surface of a copper component, the method including the step of:
bonding a resin substrate to the copper oxide-containing layer by thermocompression, wherein
when the copper component is peeled off from the resin substrate under given conditions, a signal-to-noise ratio of a peak corresponding to a substance derived from the resin substrate is 10 or less by measurement in a wavelength range of 700-4000 $cm^{-1}$ using attenuated total reflection Fourier transform infrared spectroscopy (ATR FT-IR), the substance being detected from the surface of the copper component peeled off from the resin substrate.

[1C]

A method of manufacturing a composite copper component according to [1] or [3], the method including the steps of:
1) partially coating the surface of the copper component with a silane coupling agent or an anti-corrosion agent; and
2) subjecting the partially coated surface to an oxidation treatment to form the copper oxide-containing layer.

[2C]

A method of manufacturing a composite copper component according to [16], the method including the steps of:
1) partially coating the surface of the copper component with a silane coupling agent or an anti-corrosion agent;
2) subjecting the partially coated surface to an oxidation treatment to form the copper oxide-containing layer; and
3) forming a layer containing metal other than copper on the surface subjected to the oxidation treatment.

[3C]

A method of manufacturing a composite copper component according to [16], the method including the steps of:
1) subjecting the surface of the copper component to an oxidation treatment to form the copper oxide-containing layer;
2) treating the surface subjected to the oxidation treatment with a modifier; and
3) forming a layer containing metal other than copper on the surface treated with the modifier, wherein
the modifier includes a compound selected from the group consisting of nickel chloride; zinc chloride; iron chloride; chromium chloride; ammonium citrate; potassium chloride; ammonium sulfate; ammonium chloride; nickel ammonium sulfate; ethylenediaminetetraacetic acid; diethanolglycine; tetrasodium L-glutamate diacetate; ethylenediamine-N,N'- disuccinic acid; 3-hydroxy-2,2'-iminodisuccinic acid sodium; methyl glycine diacetic acid trisodium; tetrasodium aspartate diacetate; N-(2-hydroxyethyl) iminodiacetic acid disodium; and sodium gluconate.

[4C]

A method of manufacturing a composite copper component according to [16], the method including the steps of:
1) subjecting the surface of the copper component to an oxidation treatment to form the copper oxide-containing layer;
2) treating the surface subjected to the oxidation treatment with a modifier; and
3) forming a layer containing metal other than copper on the surface treated with the modifier, wherein
the modifier includes tin(II) chloride or citric acid.

BRIEF DESCRIPTION OF THE DRAWINGS

FIG. 2-1 and FIG. 2-2 show results of visual observation of composite copper foils (in which white circles indicate that a portion of a copper foil surface was transferred to a resin substrate and cross symbols indicate that no transfer was observed) and representative photographs of the surfaces of the foils on both sides in Examples 1-8 and Comparative Examples 2-4 after the copper foils were bonded to a resin substrate by thermocompression and peeled off from there;

FIG. 3-1 to FIG. 3-7 show results of XPS analysis of the resin substrates in the Examples 1-3, Comparative Example 1, and the Comparative Examples 2-4;

FIG. 4-1 to FIG. 4-3 show results of ATR FT-IR measurement of surfaces of composite copper foils in the Examples 1-3 and the Comparative Examples 2-4 obtained after the copper foils were bonded to a resin substrate (R5670KJ) by thermocompression and peeled off from there;

FIG. 5 shows results of ATR FT-IR measurement of surfaces of composite copper foils in the Example 3 and the Comparative Example 3 obtained after the copper foils were bonded to a resin substrate (R1551GG) by thermocompression and peeled off from there;

FIG. 6-1 and FIG. 6-2 show results of ATR FT-IR measurement of surfaces of composite copper foils in the Examples 4-8 obtained after the copper foils were bonded to a resin substrate (R5680J) by thermocompression and peeled off from there;

FIG. 7 shows results of ATR FT-IR measurement of surfaces of composite copper foils in the Example 3 and the Comparative Example 3 obtained after the copper foils were bonded to a resin substrate (NX9255) by thermocompression and peeled off from there;

EMBODIMENTS FOR CARRYING OUT THE INVENTION

Figure 1:
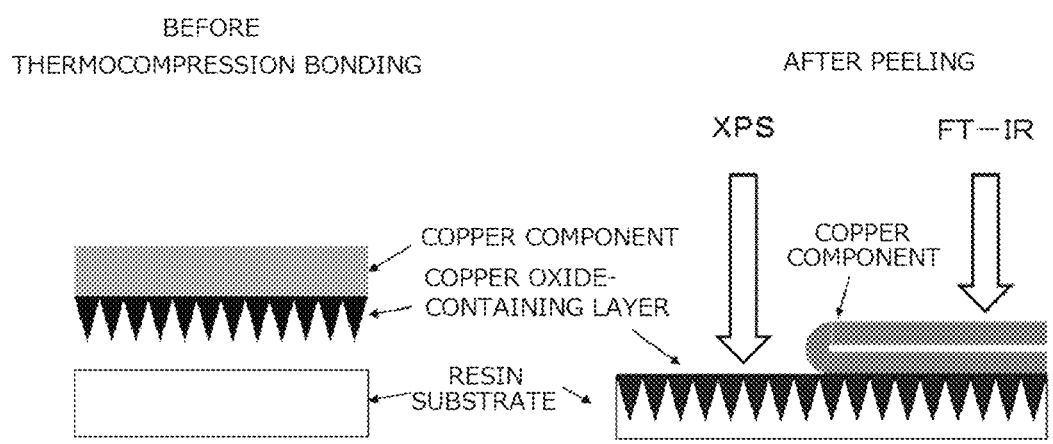
FIG. 1 shows schematic diagrams of an exemplified composite copper component of the present invention before thermocompression bonding and after peeling.

Preferred embodiments of the present invention are described in detail below with reference to the drawings, but the present invention is not limited thereto. Objects, characteristics, advantages, and ideas of the present invention are apparent to a person skilled in the art from the description of the present specification, and a person skilled in the art can easily reproduce the present invention from the description of the present specification. Modes for carrying out the invention, specific examples thereof and so forth, which are described below, provide preferable embodiments of the present invention. They are described for the purpose of illustration or explanation, and thus the present invention is not limited thereto. It is apparent to a person skilled in the art that various alterations and modifications can be made on the basis of the description of the present specification within the spirit and the scope of the present invention disclosed in the present specification.

Composite Copper Components

An embodiment of the present invention is a composite copper component including a copper oxide-containing layer formed on at least a portion of the surface of a copper component. Copper components contain, as the main component, copper (Cu) that constitutes a part of a structure. Specific examples of the copper components include, but are not limited to, copper foils such as electrolytic copper foils, rolled copper foils, and copper foils laid on a carrier; copper wires; copper plates; and copper lead frames. Copper components preferably consist of pure copper with Cu purity of 99.9% or higher by mass. It is more preferable if they are made of tough pitch copper, deoxidized copper, or oxygen-free copper. It is even more preferable if they are made of oxygen-free copper with oxygen content of 0.001% to 0.0005% by mass.

When the copper component is a copper foil, its thickness can have any value. The thickness, however, is preferably from 0.1 to 100 μm, and more preferably from 0.5 to 50 μm.

The copper oxide-containing layer, which is formed on the surface of the copper component, comprises copper oxide (CuO) and/or cuprous oxide ($Cu_2O$). This copper oxide-containing layer can be formed by oxidizing the surface of the copper component, and such oxidation roughens that surface. Protrusions on the oxidized surface of the copper component may be modified by exposing the copper oxide-containing layer to a dissolving agent. The surface of the copper oxide-containing layer may be reduced using a reducing agent. In such a case, cuprous oxide may be formed on the surface of the copper oxide-containing layer. The specific resistance of pure copper is $1.7 \times 10^{-8}$ (Ωm), whereas that of copper oxide is 1 to 10 (Ωm) and that of cuprous oxide is $1 \times 10^6$ to $1 \times 10^7$ (Ωm). Thus, the copper oxide-containing layer has low conductivity. This means that transmission losses due to the skin effect are unlikely to occur for circuits on a printed wiring board or a semiconductor package substrate formed using a composite copper component according to the present invention, even when a larger amount of the copper oxide-containing layer has been transferred to a resin substrate.

Each copper oxide-containing layer may contain metal other than copper. Any metal can be included, but the copper oxide-containing layer may contain at least one metal selected from the group consisting of Sn, Ag, Zn, Al, Ti, Bi, Cr, Fe, Co, Ni, Pd, Au, and Pt. In particular, to exhibit acid and heat resistance, the copper oxide-containing layer preferably contains metal having a higher acid resistance and heat resistance than copper, such as Ni, Pd, Au, and Pt.

The metal other than copper may be deposited on the top surface of the copper component by plating. Any plating technique can be used, and examples include electrolytic plating, electroless plating, vacuum deposition, and chemical conversion treatment. Among them, electrolytic plating is preferred because it is desirable to form a uniform and thin plating layer. When an oxidized copper foil surface is electrolytically plated, the copper oxide on the surface is first reduced to cuprous oxide or pure copper. This consumes electrical charge, resulting in a time delay before the completion of plating, and subsequently, the metal that forms a metal layer begins to deposit. The amount of charge depends on the type of plating solution and the amount of copper oxide used. For example, when a copper component is plated with nickel, it is preferable to apply a charge ranging from 15 C to 75 C per $dm^2$ of area of the copper component to be electrolytically plated, and it is more preferable to apply a charge ranging from 25 C to 65 C, in order to keep the thickness of the nickel plating within a desirable range.

The deposition of the metal other than copper on the top surface of the copper component by plating may have an average thickness of any value taken in the vertical direction, but the thickness is preferably 6 nm or more, and more preferably 10 nm or more, 14 nm or more, 18 nm or more, or 20 nm or more. The thickness is, however, preferably 80 nm or less, and more preferably 70 nm or less, or 60 nm or less.

The average vertical thickness of deposition of the metal other than copper contained in the copper oxide-containing layer can be calculated by dissolving the copper oxide-containing layer in an acidic solution, determining the amount of metal by inductively coupled plasma (ICP) analysis, and dividing the amount by the area of the composite copper component. Alternatively, the average vertical thickness can be calculated by dissolving the whole composite copper component and measuring only the amount of metal contained in the copper oxide-containing layer.

When a surface of the composite copper component with the copper oxide-containing layer formed thereon is subjected to thermocompression bonding (thermal press fitting) to a resin substrate, the surface profile of the composite copper component is imprinted into the resin substrate. When the thermocompression-bonded composite copper component is peeled off from the resin substrate, the metal present in the copper oxide-containing layer adheres (transfer)) to the resin substrate. An embodiment of a composite copper component is shown in FIG. 1.

The resin substrate is a material that comprises resin as a main component and can be used to form circuits on, for example, printed circuit boards or semiconductor package substrates. Any resin can be used, and the resin may be either thermoplastic or thermosetting. The resin is preferably polyphenylene ether (PPE), epoxy, polyphenylene oxide (PPO), polybenzoxazole (PBO), polytetrafluoroethylene (PTFE), a liquid crystal polymer (LCP), triphenylphosphite (TPPI), a fluoropolymer, polyetherimide, polyetheretherketone, polycycloolefin, a bismaleimide resin, low dielectric constant polyimide, a cyanate resin, or their mixed resin. The resin substrate may also contain inorganic fillers and/or glass fibers.

The resin substrate can be bonded to the surface of the composite copper component by thermocompression by, for example, laminating the resin substrate on the composite copper component in close contact to each other, and then treating them under given conditions to bond the resin substrate and the composite copper component to each other. As to the given conditions (temperature, pressure, and time), conditions recommended by each substrate manufacturer may be used. For example, the following conditions can be considered.

1) If the resin substrate contains or consists of an epoxy resin, the composite copper component is bonded to the resin substrate by thermocompression preferably by applying a pressure ranging from 0-20 MPa at 50° C.-300° C. for 1 minute to 5 hours.

For example, 1-1) when the resin substrate is R-1551 (manufactured by Panasonic Corp.), the composite copper component is subjected to thermocompression bonding by heating it at a pressure of 1 MPa; after the temperature reaches 100° C., holding it at this temperature for 5-10 minutes; subsequently, further heating it at a pressure of 3.3 MPa; and, after the temperature reaches 170° C.-180° C., holding it at this temperature for 50 minutes;

1-2) when the resin substrate is R-1410A (manufactured by Panasonic Corp.), the composite copper component is subjected to thermocompression bonding by heating it at a pressure of 1 MPa; after the temperature reaches 130° C., holding it at this temperature for 10 minutes; subsequently, further heating it at a pressure of 2.9 MPa; and, after the temperature reaches 200° C., holding it at this temperature for 70 minutes;

1-3) when the resin substrate is EM-285 (manufactured by EMC), the composite copper component is subjected to thermocompression bonding by heating it at a pressure of 0.4 MPa; after the temperature reaches 100° C., further heating it under an increased pressure of 2.4-2.9 MPa; and, after the temperature reaches 195° C., holding it at this temperature for 50 minutes; or 1-4) when the resin substrate is GX13 (manufactured by Ajinomoto Fine-Techno Co., Inc.), the composite copper component is subjected to thermocompression bonding by heating it while applying a pressure of 1.0 MPa; and holding it at 180° C. for 60 minutes.

2) If the resin substrate contains or consists of a PPE resin, the composite copper component is bonded to the resin substrate by thermocompression preferably by applying a pressure ranging from 0 to 20 MPa at 50° C.-350° C. for 1 minute to 5 hours.

For example, 2-1) when the resin substrate is R5620 (manufactured by Panasonic Corp.), the composite copper component is subjected to thermocompression bonding by heating it at a pressure of 0.5 MPa until the temperature reaches 100° C.; and subsequently, it is further subjected to thermocompression bonding by increasing the temperature and pressure, and holding it at 2.0-3.0 MPa and 200° C.-210° C. for 120 minutes;

2-2) when the resin substrate is R5670 (manufactured by Panasonic Corp.), the composite copper component is subjected to thermocompression bonding by heating it at a pressure of 0.49 MPa until the temperature reaches 110° C.; and subsequently, it is further subjected to thermocompression bonding by increasing the temperature and pressure, and holding it at 2.94 MPa and 210° C. for 120 minutes;

2-3) when the resin substrate is R5680 (manufactured by Panasonic Corp.), the composite copper component is subjected to thermocompression bonding by heating it at a pressure of 0.5 MPa until the temperature reaches 110° C.; and subsequently, it is further subjected to thermocompression bonding by increasing the temperature and pressure, and holding it at 3.0-4.0 MPa and 195° C. for 75 minutes; or 2-4) when the resin substrate is N-22 (manufactured by Nelco), the composite copper component is subjected to thermocompression bonding by heating it while applying a pressure of 1.6-2.3 MPa; holding it at 177° C. for 30 minutes; subsequently, further heating it; and holding it at 216° C. for 60 minutes.

3) If the resin substrate contains or consists of a PTFE resin, the composite copper component is bonded to the resin substrate by thermocompression preferably by applying a pressure ranging from 0 to 20 MPa at 50° C.-400° C. for 1 minute to 5 hours.

For example, 3-1) when the resin substrate is NX9255 (manufactured by Park Electrochemical Corp.), the composite copper component is subjected to thermocompression bonding by heating it while applying a pressure of 0.69 MPa until the temperature reaches 260° C.; increasing the pressure to 1.03-1.72 MPa and heating the composite copper component up to 385° C.; and holding it at 385° C. for 10 minutes; or 3-2) when the resin substrate is R03003 (manufactured by Rogers Corp.), the composite copper component is subjected to thermocompression bonding by applying a pressure to 2.4 MPa after the elapse of 50 minutes (approximately 220° C.) from the beginning of press; and holding the composite copper component at 371° C. for 30-60 minutes.

Any conditions can be used for peeling off the copper component from the resin substrate, such as on the basis of a 90° peeling test (Japanese Industrial Standard (JIS) C5016 "Test methods for flexible printed wiring boards" corresponding international standards IEC2 49-1:1982 and IEC326-2:1 IEC326-2:1990).

Metal in the copper oxide-containing layer is present on the resin substrate from which the copper component has been peeled off. The metal transferred to the surface of the resin substrate after the copper component has been peeled off can be detected using various methods (e.g., X-ray photoelectron spectroscopy (XPS), energy-dispersive X-ray spectroscopy (EDS), ICP optical emission spectroscopy (high-frequency inductively coupled plasma optical emission spectroscopy, ICP-OES/ICP-AES)).

XPS is a technique for energy analysis by irradiating an object with X-rays and capturing photoelectrons $e^-$ emitted as the object is ionized. XPS can be used to determine the type, amount, and chemical bonding state of elements present on the surface of a sample or at a predetermined depth from the surface (e.g., to a depth of 6 nm). The suitable diameter of the analysis spot (i.e., the diameter of the cross-section of a cylindrical part that can be analyzed when cut into a circle) ranges from 1 µm to 1 mm.

The metal in the copper oxide-containing layer is preferably transferred to the resin substrate such that it fills 80% or more, 90% or more, 95% or more, 99% or more, or 99.9% or more of the recesses in the imprinted surface profile. For embodiments with most of the recesses being filled, when the surface of the resin substrate is measured using XPS, which performs the elemental analysis of the sample surface, the sum of the peak intensities of the spectra of metal atoms (copper atoms and metal atoms other than copper) is larger than the peak intensity of C1s in the spectrum. There are multiple peaks for metal elements, but the term "peak" as used herein refers to the main peak for each metal element. For example, the Cu2p3, Sn3d5, Ag 3d5, Zn 2p3, Al 2p, Ti 2p3, Bi 4f7, Cr 2p3, Fe 2p3, Co 2p3, Ni2p3, Pd 3d5, Au 4f7, and Pt 4f7 orbitals correspond to the main peaks. The intensity of the peak in the spectrum here is the height in the direction of the vertical axis of the XPS spectral data shown in FIG. 3.

For the amount of metal in the copper oxide-containing layer, the percentage of Cu2p3, measured by X-ray photoelectron spectroscopy (XPS), relative to the total number of atoms that are present in the surface of the resin substrate from which the copper component has been peeled off, is preferably 1.0 atom % or more, 1.8 atom % or more, 2.8 atom % or more, 3.0 atom % or more, 4.0 atom % or more, 5.0 atom % or more, or 6.0 atom % or more. Alternatively, the ratio (in percentage) of Cu2p3/C1s in surface atomic composition is preferably 0.010 or more, 0.015 or more, 0.020 or more, 0.025 or more, 0.030 or more, 0.035 or more, 0.040 or more, 0.045 or more, 0.050 or more, or 0.10 or more, when the surface of the copper component after imprinting is measured by XPS.

In the case that the copper oxide-containing layer contains metal other than copper, a sum of percentages of metal atoms (copper atoms and metal atoms other than copper) in surface atomic composition on the surface of the removed resin substrate, as measured by X-ray photoelectron spectroscopy (XPS), is 1.0 atom % or more, 1.5 atom % or more, 1.8 atom % or more, 2.8 atom % or more, 3.0 atom % or more, 4.0 atom % or more, 5.0 atom % or more, or 6.0 atom % or more. Alternatively, the ratio of a sum of percentages of metal atoms (copper atoms and metal atoms other than copper) in surface atomic composition to a percentage of C1s in surface atomic composition is preferably 0.010 or more, 0.015 or more, 0.020 or more, 0.025 or more, 0.030 or more, 0.035 or more, 0.040 or more, 0.045 or more, 0.050 or more, or 0.10 or more.

It is preferable that no or a small amount of, if any, organic matter originating from the resin substrate is detected from the surface of the copper component peeled off from the resin substrate. This shows that the resin substrate is not broken during peeling. Any method may be used to detect organic matter originating from the resin substrate. For example, it can be done by detecting the peak originating from the resin substrate by attenuated total reflection Fourier transform infrared spectroscopy (FT-IR).

FT-IR is an infrared spectroscopy method that irradiates a target substance to be measured with infrared light and uses the infrared absorption spectrum to identify and/or quantify a compound. In the present invention, it can be used to detect organic substances originating from resin substrates.

Peaks derived from resin substrates are shown in "Infrared and Raman Spectroscopy: Principles and Spectral Interpretation" by Peter Larkin. In a wavelength range of 700-4000 $cm^{-1}$, the signal-to-noise (S/N) ratio is preferably 10 or less, or 9 or less, and more preferably 8 or less, or 7 or less. It is preferable no peak originating from the resin substrate is detected.

The arithmetic mean roughness (Ra) of the surface of the composite copper component with the copper oxide-containing layer formed thereon is preferably 0.04 µm or more, more preferably 0.1 µm or more, and is preferably 0.3 µm or less, and more preferably 0.2 µm or less.

The maximum height roughness (Rz) of the surface of the composite copper component with the copper oxide-containing layer formed thereon is preferably 0.2 µm or more, more preferably 1.0 µm or more, and is preferably 2.0 µm or less, and more preferably 1.7 µm or less.

When Ra and Rz are too small, adhesion to the resin substrate will be insufficient, and when they are too large, fine wiring formability and high-frequency characteristics will be inferior.

Here, the arithmetic mean roughness (Ra) is the average of absolute values of Z(x) (i.e., profile peak heights and profile valley depths) on a profile curve (y=Z(x)) within a reference length 1, expressed by the following equation.

$$Ra = \frac{1}{l} \int_0^l |Z(x)| dx \quad \text{[Equation 1]}$$

The maximum height roughness (Rz) is the sum of the maximum values of profile peak height Zp and profile valley depth Zv of the profile curve (y=Z(x)) within the reference length 1.

Ra and Rz can be calculated using the specified method in JIS B 0601:2001 (in accordance with the international standard ISO 4287-1997).

The ratio of Ra after peeling to Ra before thermocompression bonding on the surface of the composite copper component with the copper oxide-containing layer formed thereon is preferably less than 100%, less than 96%, less than 95%, less than 94%, less than 93%, less than 92%, less than 91%, less than 90%, less than 80%, less than 70%, less than 65%, or less than 60%. The smaller percentage indicates that the more metal forming the copper oxide-containing layer has been transferred to the resin substrate.

The ratio of surface area after peeling to that before thermocompression bonding of the composite copper component with the copper oxide-containing layer formed thereon is preferably less than 100%, less than 98%, less than 97%, less than 96%, less than 95%, less than 94%, less than 93%, less than 92%, less than 91%, less than 90%, less than 80%, or less than 75%. The smaller percentage indicates that more metal forming the copper oxide-containing layer has been transferred to the resin substrate.

The surface area can be measured using a confocal or atomic force microscope.

In the composite copper component in one embodiment of the present invention, the surface of the composite copper component with the copper oxide-containing layer formed thereon has a mean width (RSm) of any value, of the roughness curve elements, but the mean width is preferably 1500 nm or less, 1400 nm or less, 1300 nm or less, 1200 nm or less, 1100 nm or less, 1000 nm or less, 900 nm or less, 800 nm or less, 750 nm or less, 700 nm or less, 650 nm or less, 600 nm or less, 550 nm or less, 450 nm or less, or 350 nm or less, and is more preferably 100 nm or more, 200 nm or more, or 300 nm or more. As used herein, RSm is the average of the spacings (i.e., the widths of profile curve elements: Xs1 to Xsm) of the profile containing one profile peak and one valley over the roughness curve within a certain reference length (lr) and is calculated by the following formula.

$$RSm = \frac{1}{m} \sum_{i=1}^{m} Xsi \quad \text{[Equation 2]}$$

Here, the spacing of the profile containing one peak and one valley is defined with 10% of the arithmetic mean roughness (Ra) as the minimum height discrimination for the protrusions, and 1% of the reference length (lr) as the minimum length. For example, Rsm can be measured and calculated according to "Test method for surface roughness of fine ceramic films by atomic force microscopy" (JIS R 1683:2007).

The $\Delta E^*_{ab}$ between the surface of the composite copper component before thermocompression bonding and the surface of the copper component after it was peeled off is preferably 13 or more, 15 or more, 20 or more, 25 or more, 30 or more, or 35 or more. The larger difference indicates that more metal forming the copper oxide-containing layer (i.e., the metal forming protrusions and troughs) has been transferred to the resin substrate.

Method of Manufacturing Composite Copper Components

An embodiment of the present invention is a method of manufacturing a composite copper component including a step of facilitating tearing off of the copper oxide-containing layer from the copper component.

During this step, any method can be used to facilitate tearing off of the copper oxide-containing layer from the copper component, and exemplified methods include 1) partially coating the surface of the copper component with a coating agent such as a silane coupling agent or an anti-corrosion agent before an oxidation treatment; or 2) treating the copper oxide-containing layer with nickel chloride after the oxidation treatment.

The copper oxide-containing layer is preferably formed by treating the surface of the copper component with an oxidizing agent. Any oxidizing agent can be used, such as an aqueous solution of sodium chlorite, sodium hypochlorite, potassium chlorate, or potassium perchlorate. Various additives (e.g., phosphates such as trisodium phosphate dodecahydrate) may be added to the oxidizing agent.

Any conditions can be used for the oxidation reaction, but the reaction temperature is preferably 40° C.-95° C., and more preferably 45° C.-80° C. The reaction time is preferably 0.5-30 minutes, and more preferably 1-10 minute(s).

Before the oxidation treatment, degreasing, acid cleaning to remove any natural oxide film for uniform treatment, or alkali treatment to prevent acids from being introduced into the oxidation process after acid cleaning may be performed. Any method of alkali treatment can be used, but the treatment may be performed at 30° C.-50° C. for about 0.5-2 minutes using an alkaline solution such as an aqueous solution of sodium hydroxide of preferably 0.1-10 g/L, more preferably 1-2 g/L.

The copper oxide-containing layer may be dissolved using a dissolving chemical solution containing a dissolving agent to adjust the protrusions on the surface of the copper component, or a reducing chemical solution containing a reducing agent may be used to reduce the copper oxide in the copper oxide-containing layer.

Any dissolving agent can be used, but the dissolving agent is preferably a chelating agent, especially a biodegradable chelating agent. Examples include tetrasodium L-glutamate diacetate (CMG-40), ethylenediaminetetraacetic acid (sodium salt), diethanolglycine, tetrasodium L-glutamate diacetate, ethylenediamine-N,N'-disuccinic acid, 3-hydroxy-2,2'-iminodisuccinic acid sodium, methyl glycine diacetic acid trisodium, tetrasodium aspartate diacetate, N-(2-hydroxyethyl) iminodiacetic acid disodium, and sodium gluconate.

Examples of the reducing agent that can be used include DMAB (dimethylamine borane), diborane, sodium borohydride, and hydrazine. The reducing chemical solution is a liquid containing a reducing agent, an alkaline compound (such as sodium hydroxide or potassium hydroxide), and a solvent (such as pure water).

A layer containing metal other than copper can be formed on top of the copper oxide-containing layer. The layer containing metal other than copper can be formed by, for example, plating the copper oxide-containing layer with the metal other than copper. Plating can be performed according to a known technique, and metal such as Sn, Ag, Zn, Al, Ti, Bi, Cr, Fe, Co, Ni, Pd, Au, or Pt, or other various alloys can be used as the metal other than copper. For plating processes, any technique such as electrolytic plating, electroless plating, vacuum deposition, or conversion treatment can be used. Electrolytic plating, however, is preferred because it is desirable to form a uniform and thin plated layer.

For electrolytic plating, nickel plating and nickel alloy plating are preferred. Examples of metal that has been deposited by nickel plating and nickel alloy plating include pure nickel, Ni—Cu alloys, Ni—Cr alloys, Ni—Co alloys, Ni—Zn alloys, Ni—Mn alloys, Ni—Pb alloy, and Ni—P alloys.

Examples of metal salts used for plating include nickel sulfate, nickel sulfamate, nickel chloride, nickel bromide, zinc oxide, zinc chloride, diamminedichloropalladium, iron sulfate, iron chloride, chromic anhydride, chromium chloride, sodium chromium sulfate, copper sulfate, copper pyrophosphate, cobalt sulfate, and manganese sulfate.

In nickel plating, a preferable bath composition includes, for example, nickel sulfate (100 g/L or more and 350 g/L or less), nickel sulfamate (100 g/L or more and 600 g/L or less), nickel chloride (0 g/L or more and 300 g/L or less), and mixtures thereof. Sodium citrate (0 g/L or more and 100 g/L or less) or boric acid (0 g/L or more and 60 g/L or less) may be included as an additive.

For electroless nickel plating, electroless plating with a catalyst is preferred. As a catalyst, it is preferable to use iron, cobalt, nickel, ruthenium, rhodium, palladium, osmium, iridium, or their salts. Electroless plating with a catalyst can produce a uniform metal layer without any sparse grains, thereby improving the heat resistance of the composite copper foil.

An embodiment of a method of manufacturing a composite copper component according to the present invention includes the steps of 1) partially coating the surface of the copper component with a silane coupling agent or an anti-corrosion agent; and 2) subjecting the partially coated surface of the copper component to an oxidation treatment to form the copper oxide-containing layer; or 1) partially coating the surface of the copper component with a silane coupling agent or an anti-corrosion agent; 2) subjecting the partially coated surface of the copper component to an oxidation treatment to form the copper oxide-containing layer; and 3) forming a layer containing metal other than copper on the surface with the copper oxide-containing layer formed thereon.

By partially coating the surface of the copper component with a coating agent such as a silane coupling agent or an anti-corrosion agent, the coated area is spared from being subjected to oxidation and voids are created in the copper oxide-containing layer, making it easier for the copper oxide-containing layer to break away or torn off from the copper component.

Any silane coupling agent can be used, and one may be selected from silane, tetraorgano-silane, aminoethyl-aminopropyl-trimethoxysilane, (3-aminopropyl)trimethoxysilane, (1-[3-(trimethoxysilyl)propyl]urea) ((1-[3-(trimethoxysilyl)propyl]urea)), (3-aminopropyl)triethoxysilane, ((3-glycidyl-oxypropyl)trimethoxysilane), (3-chloropropyl)trimethoxysilane, (3-glycidyl-oxypropyl)trimethoxysilane, dimethyldichlorosilane, 3-(trimethoxysilyl)propylmethacrylate, ethyltriacetoxysilane, triethoxy(isobutyl)silane, triethoxy(octyl)silane, tris(2-methoxyethoxy)(vinyl)silane, chlorotrimethylsilane, methyltrichlorosilane, silicon tetrachloride, tetraethoxysilane, phenyltrimethoxysilane, chlorotriethoxysilane, and ethylene-trimethoxysilane.

Any anti-corrosion agent can be used, and one may be selected from 1H-tetrazole, 5-methyl-1H-tetrazole, 5-amino-1H-tetrazole, 5-phenyl-1H-tetrazole, 1,2,3-triazole, 1,2,4-triazole, 1,2,3-benzotriazole, 5-methyl-1H-benzotriazole, 5-amino-1H-benzotriazole, 2-mercaptobenzothiazole, 1,3-dimethyl-5-pyrazolone, pyrrole, 3-methylpyrrole, 2,4-dimethylpyrrole, 2-ethylpyrrole, pyrazole, 3-aminopyrazole, 4-methylpyrazole, 3-amino-5-hydroxypyrazole, thiazole, 2-aminothiazole, 2-methylthiazole, 2-amino-5-methylthiazole, 2-ethylthiazole, benzothiazole, imidazole, 2-methylimidazole, 2-ethylimidazole, 2-butylimidazole, 5-aminoimidazole, 6-aminoimidazole, benzimidazole, and 2-(methylthio)benzimidazole.

Treatment with a silane coupling agent or an anti-corrosion agent may be performed at any time prior to the oxidation, and may be performed in conjunction with degreasing, acid cleaning to remove any natural oxide film for uniform treatment, or alkaline treatment to prevent acids from being introduced into the oxidation process after acid cleaning.

For the treatment with a silane coupling agent or an anti-corrosion agent, it is preferable that the surface of the copper component is partially (e.g., 1%, 5%, 10%, 20%, 30%, 40%, 50%, 60%, 70%, 80%, 90% or more, but less than 100%) coated. For this purpose, it is preferable to allow it to react at a concentration of 0.1%, 0.5%, 1% or 2% or more for 30 seconds, 1 minute, or 2 minutes or more at room temperature.

An embodiment of a method of manufacturing a composite copper component according to the present invention includes the steps of 1) subjecting the surface of the copper component to an oxidation treatment to form the copper oxide-containing layer; and 2) treating the surface of the copper component with the copper oxide-containing layer formed thereon with a modifier; or 1) subjecting the surface of the copper component to an oxidation treatment to form the copper oxide-containing layer; 2) treating the surface of the copper component with the copper oxide-containing layer formed thereon with a modifier; and 3) forming a layer containing metal other than copper on the surface of the composite copper component treated with the modifier, with the copper oxide-containing layer formed thereon.

It is thought that a treatment with a modifier partially erodes the copper oxide near the boundary between the copper component and the copper oxide-containing layer, making it easier for the copper oxide-containing layer to leave from the copper component.

Any modifier can be used for facilitating the tearing off of the copper oxide-containing layer from the copper component, as long as the modifier contains an ingredient that dissolves copper oxide. The modifier is not limited to nickel chloride and may be selected from chlorides (e.g., zinc chloride, iron chloride, and chromium chloride), ammonium salts (e.g., ammonium citrate, potassium chloride, ammonium sulfate, ammonium chloride, nickel ammonium sulfate), chelating agents (e.g., ethylenediaminetetraacetic acid, diethanolglycine, tetrasodium L-glutamate diacetate, ethylenediamine-N,N'-disuccinic acid, 3-hydroxy-2,2'-iminodisuccinic acid sodium, methyl glycine diacetic acid trisodium, tetrasodium aspartate diacetate, N-(2-hydroxyethyl)iminodiacetic acid disodium, and sodium gluconate), tin(II) chloride, and citric acid.

For treatments with nickel chloride, it is preferable, but is not limited, to immerse the copper component with the copper oxide-containing layer formed thereon in a nickel chloride solution (at a concentration of 45 g/L or more) for 5 seconds or more at room temperature. Other than the treatment with nickel chloride alone, it may also be performed at the same time as oxidation treatment, or after oxidation treatment and at the same time as plating treatment. For example, nickel chloride may be contained in a plating bath and, and the copper component with the copper oxide-containing layer formed thereon may be immersed in the plating bath for 5, 10, 15, 20, or 30 seconds or 1 minute, or 2 minutes before plating. The time of immersion can vary as necessary depending on, for example, the thickness of an oxide layer.

Method of Using Composite Copper Components

The composite copper components of the present invention can be used for:
(1) manufacturing a laminate by bonding a composite copper component to a resin substrate by compression;
(2) obtaining a resin substrate with a part or all of metal constituting the copper oxide-containing layer by bonding a composite copper component to a resin substrate by compression and peeling it off;
(3) manufacturing a printed wiring board by bonding a composite copper component to a resin substrate by compression in SAP or MSAP, peeling it off to obtain a resin substrate with a part or all of metal constituting the copper oxide-containing layer, and then plating the surface of the resin substrate that has been peeled off with copper.

In (1) through (3), the resin substrate and the conditions in the method of bonding a composite copper component to a resin substrate by thermocompression may be the same as or different from those used for X-ray photoelectron spectroscopy measurements.

In (2) and (3), the conditions in the method of peeling may be the same as or different from those used for X-ray photoelectron spectroscopy measurements.

In (3), the method of copper plating may be electrolytic or electroless plating.

EXAMPLES

<1. Production of Composite Copper Foils>

In Examples 1-9 and Comparative Examples 2 and 3, a shiny side (a glossy side, which is flatter compared with the opposite side) of a copper foil (DR-WS, thickness: 18 μm), manufactured by FURUKAWA ELECTRIC CO., LTD., was used. In Comparative Example 4, a matte side of a copper foil (FV-WS, thickness: 18 μm), manufactured by FURUKAWA ELECTRIC CO., LTD., was used as a test piece without any treatment.

(1) Pretreatment (PS)

First, the copper foils were immersed in a solution described below at 25° C. for 1 minute:
in the Examples 1 and 2, potassium carbonate 2.5 g/L and KBE-903 (3-aminopropyltriethoxysilane; Shin-Etsu Silicone) 1 vol. %;
in the Example 3, potassium carbonate 2.5 g/L and potassium bicarbonate 0.06 g/L;
in the Examples 4-6, potassium hydroxide 5 g/L;
in the Example 7, potassium hydroxide 5 g/L and KBM-603 (N-2-(aminoethyl)-3-aminopropyltrimethoxysilane; Shin-Etsu Silicone) 5 vol. %;
in the Example 8, potassium hydroxide 5 g/L and BTA (benzotriazole) 1 wt. %;
in the Comparative Example 2, a solution of 2.5 g/L of potassium carbonate; and
in the Comparative Example 3, a solution of potassium carbonate 2.5 g/L, and potassium bicarbonate 0.06 g/L.

(2) Oxidation Treatment (AS)

The pretreated copper foils were immersed in an oxidizing agent for the oxidation treatment.

In the Examples 1, 2, 7, and 8, and the Comparative Example 2, a solution of 58.3 g/L of sodium chlorite, 20 g/L of potassium hydroxide, and 39.1 g/L of potassium carbonate was used as an oxidizing agent.

In the Examples 3-6, a solution of 45 g/L of sodium chlorite, 12 g/L of potassium hydroxide, and 2 g/L of KBM-403 (3-glycidoxypropyltrimethoxysilane; Shin-Etsu Silicone) was used as an oxidizing agent.

In the Comparative Example 3, a solution of 58.8 g/L of sodium chlorite, 8.8 g/L of potassium hydroxide, 3 g/L of potassium carbonate, and 2 g/L of KBM-403 (3-glycidoxypropyltrimethoxysilane; Shin-Etsu Silicone) was used as an oxidizing agent.

The copper foils in the Examples 1, 2, 7, and 8 were immersed in the oxidizing agent at 73° C. for 6 minutes. Those in the Examples 3-6 and the Comparative Examples 2 and 3 were immersed in the oxidizing agent at 73° C. for 2 minutes.

(3) Plating Pretreatment

After the oxidation treatment, plating pretreatment was performed in the Examples 4-6 using modifiers as follows.

The copper foil in the Example 4 was treated using a solution of 45 g/L of tin(II) chloride dihydrate and 1 mL/L of hydrochloric acid at 45° C. for 10 seconds.

The copper foil in the Example 5 was treated using a solution of 45 g/L of ammonium chloride at 45° C. for 60 seconds.

The copper foil in the Example 6 was treated using a solution of 5 mL/L of 50% citric acid at 45° C. for 60 seconds.

(4) Electrolytic Plating

After the oxidation treatment, in the Examples 2 and 3 and the Comparative Example 3, electrolytic plating was performed using a first nickel electrolytic plating solution (nickel sulfate 240 g/L, nickel chloride 45 g/L, and sodium citrate 20 g/L). After the plating pretreatment, in the Examples 4-6, electrolytic plating was performed using a second nickel electrolytic plating solution (nickel sulfate 240 g/L, and sodium citrate 20 g/L). The copper foil in the Example 3 was immersed in a nickel electrolytic plating solution for 1 minute before electrolytic plating. The electrolytic plating was performed at 50° C. and a current density of 0.5 A/dm$^2$×45 s (=22.5 C/dm$^2$ copper foil area).

For each of the Examples and the Comparative Examples, multiple test specimens were produced under the same above conditions. These conditions are summarized in Table 1.

TABLE 1

| | Components | | | Examples | | | | | | | | Comparative Examples | | |
|---|---|---|---|---|---|---|---|---|---|---|---|---|---|---|
| Treatment | Details | or conditions | Unit | 1 | 2 | 3 | 4 | 5 | 6 | 7 | 8 | 2 | 3 | 4 |
| PS | Composition | potassium carbonate | g/L | 2.5 | 2.5 | 2.5 | 0 | 0 | 0 | 0 | 0 | 2.5 | 2.5 | — |

TABLE 1-continued

| Treatment | Details | Components or conditions | Unit | Ex 1 | Ex 2 | Ex 3 | Ex 4 | Ex 5 | Ex 6 | Ex 7 | Ex 8 | CE 2 | CE 3 | CE 4 |
|---|---|---|---|---|---|---|---|---|---|---|---|---|---|---|
| | | potassium hydrogen carbonate | g/L | 0 | 0 | 0.06 | 0 | 0 | 0 | 0 | 0 | 0 | 0.06 | — |
| | | potassium hydroxide | g/L | 0 | 0 | 0 | 5 | 5 | 5 | 5 | 5 | 0 | 0 | — |
| | | KBM-603 | vol. % | 0 | 0 | 0 | 0 | 0 | 0 | 5 | 0 | 0 | 0 | — |
| | | BTA | wt. % | 0 | 0 | 0 | 0 | 0 | 0 | 0 | 1 | 0 | 0 | — |
| | | KBE-903 | vol. % | 1 | 1 | 0 | 0 | 0 | 0 | 0 | 0 | 0 | 0 | — |
| | Treatment | Temp. | ° C. | 25 | 25 | 25 | 25 | 25 | 25 | 25 | 25 | 25 | 25 | — |
| | | Time | min. | 1 | 1 | 1 | 1 | 1 | 1 | 1 | 1 | 1 | 1 | — |
| AS | Composition | sodium chlorite | g/L | 58.3 | 58.3 | 45 | 45 | 45 | 45 | 58.3 | 58.3 | 58.3 | 58.8 | — |
| | | potassium hydroxide | g/L | 20 | 20 | 12 | 12 | 12 | 12 | 20 | 20 | 20 | 8.8 | — |
| | | potassium carbonate | g/L | 39.1 | 39.1 | 0 | 0 | 0 | 0 | 39.1 | 39.1 | 39.1 | 3 | — |
| | | KBM-403 | g/L | 0 | 0 | 2 | 2 | 2 | 2 | 0 | 0 | 0 | 2 | — |
| | Treatment | Temp. | ° C. | 73 | 73 | 73 | 73 | 73 | 73 | 73 | 73 | 73 | 73 | — |
| | | Time | min. | 6 | 6 | 2 | 2 | 2 | 2 | 6 | 6 | 2 | 2 | — |
| Pretreatment for Plating | Composition | tin(II) chloride, dihydrate | g/L | — | — | — | 45 | 0 | 0 | — | — | — | — | — |
| | | ammonium chloride | g/L | — | — | — | 0 | 45 | 0 | — | — | — | — | — |
| | | 50% citric acid solution | mL/L | — | — | — | 0 | 0 | 45 | — | — | — | — | — |
| | | hydrochloric acid | mL/L | — | — | — | 1 | 0 | 0 | — | — | — | — | — |
| | Treatment | Temp. | ° C. | — | — | — | 45 | 45 | 45 | — | — | — | — | — |
| | | Time | min. | — | — | — | 10 | 60 | 60 | — | — | — | — | — |
| Plating | Composition | nickel sulfate | g/L | — | 240 | 240 | 240 | 240 | 240 | — | — | — | 240 | — |
| | | nickel chloride | g/L | — | 45 | 45 | 0 | 0 | 0 | — | — | — | 45 | — |
| | | sodium citrate | g/L | — | 20 | 20 | 20 | 20 | 20 | — | — | — | 20 | — |

<2. Compression Bonding, and Peeling of Resin Substrates>
(1) Method

R5670KJ (manufactured by Panasonic Corp.), R5680J (manufactured by Panasonic Corp.), CT-Z (manufactured by Kuraray Co., Ltd.), NX9255 (manufactured by Park Electrochemical Corp.), and R1551GG (manufactured by Panasonic Corp.) were used as prepregs for the test specimens of the Examples 1-8 and the Comparative Examples 2-4 to conduct peel tests of the resin substrates.

First, each prepreg was laminated to the test specimens and bonded by thermocompression under vacuum using a vacuum high-pressure press machine to obtain laminated samples. When the resin substrate was R5670KJ (manufactured by Panasonic Corp.), the sample was subjected to thermocompression bonding while heating it at a pressure of 0.49 MPa until the temperature reached 110° C.; subsequently, the temperature and pressure were increased, and the sample was subjected to thermocompression bonding by holding it at 2.94 MPa and 210° C. for 120 minutes. When the resin substrate is R5680J (manufactured by Panasonic Corp.), the sample was subjected to thermocompression bonding while heating it at a pressure of 0.5 MPa until the temperature reached 110° C.; subsequently, the temperature and pressure were increased, and the sample was subjected to thermocompression bonding by holding it at 3.5 MPa and 195° C. for 75 minutes. When the resin substrate is NX9255 (Park Electrochemical Corp.), the sample was subjected to thermocompression bonding by heating it while applying a pressure of 0.69 MPa until the temperature reached 260° C., heating it at an increased pressure of 1.5 MPa until the temperature reached 385° C., and holding it at 385° C. for 10 minutes. When the resin substrate is R1551GG (manufactured by Panasonic Corp.), the sample was subjected to thermocompression bonding by heating it at a pressure of 1 MPa and, after the temperature reached 100° C., holding it at this temperature for 10 minutes; subsequently, further heating the sample at a pressure of 3.3 MPa and, after the temperature reached 180° C., holding it at this temperature for 50 minutes. When the resin substrate is CT-Z (Kuraray Co., Ltd.), the sample was subjected to thermocompression bonding by heating it at a pressure of 0 MPa, holding it at 260° C. for 15 minutes, further heating it while applying a pressure of 4 MPa, and holding it at 300° C. for 10 minutes. For these laminated samples, copper components were peeled off from the resin substrate according to the 90° peeling test (Japanese Industrial Standard (JIS) C5016) (FIG. 1). The results of visual observation are given in FIG. 2-1. Photographs of the surfaces of the resin and copper foil sides after the separation are shown in FIG. 2-2 for typical combinations.

Figure 2:
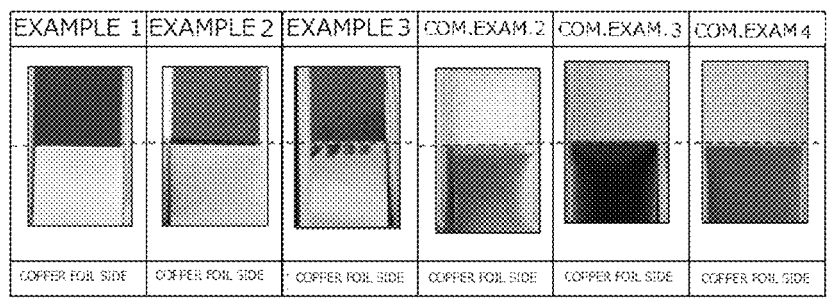
Figure 2:
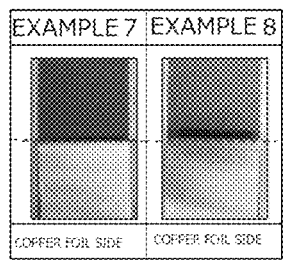
Figure 2:
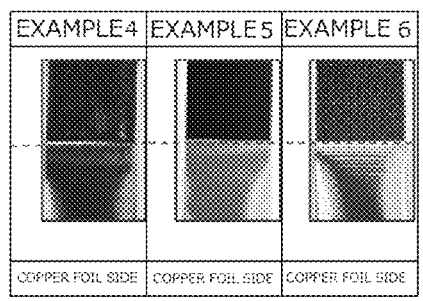
Figure 2:
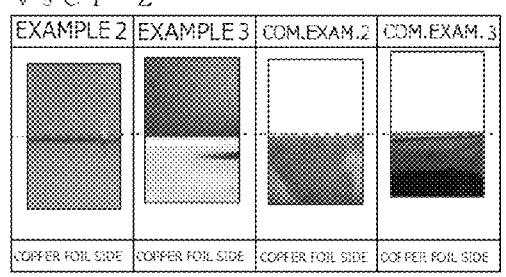
Figure 2:
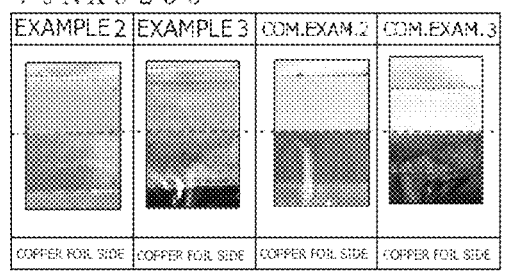
Figure 2:
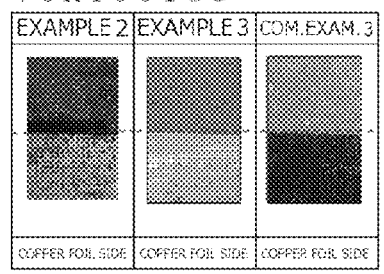

From FIG. 2, it can be easily observed that in the Examples, the surface of the copper foil was transferred to the resin side, whereas in the Comparative Examples, the surface of the copper foil was not transferred to the resin side. To prove this as a material, surface analysis was performed as follows.

<3. Surface Analysis of Resin Substrates After Separation>

Elemental analysis was performed on the surface of the resin substrates after being peeled off. Specifically, the obtained resin substrates were analyzed using Quantera- SXM (manufactured by ULVAC-PHI, Inc.) under the following conditions. As a negative control, an untreated resin substrate (R5670KJ; MEGTRON6) was analyzed (Comparative Example 1)

(1) Survey Spectrum

First, the elements were detected under the following conditions:

X-ray source: Monochromatic Al Kα (1486.6 eV)
X-ray beam diameter: 100 μm (25 w) (15 kV)
Pass energy: 280 eV, 1 eV step
Point analysis: φ100 μm
Cycle: 8

(2) Results

Figures 1, 3:
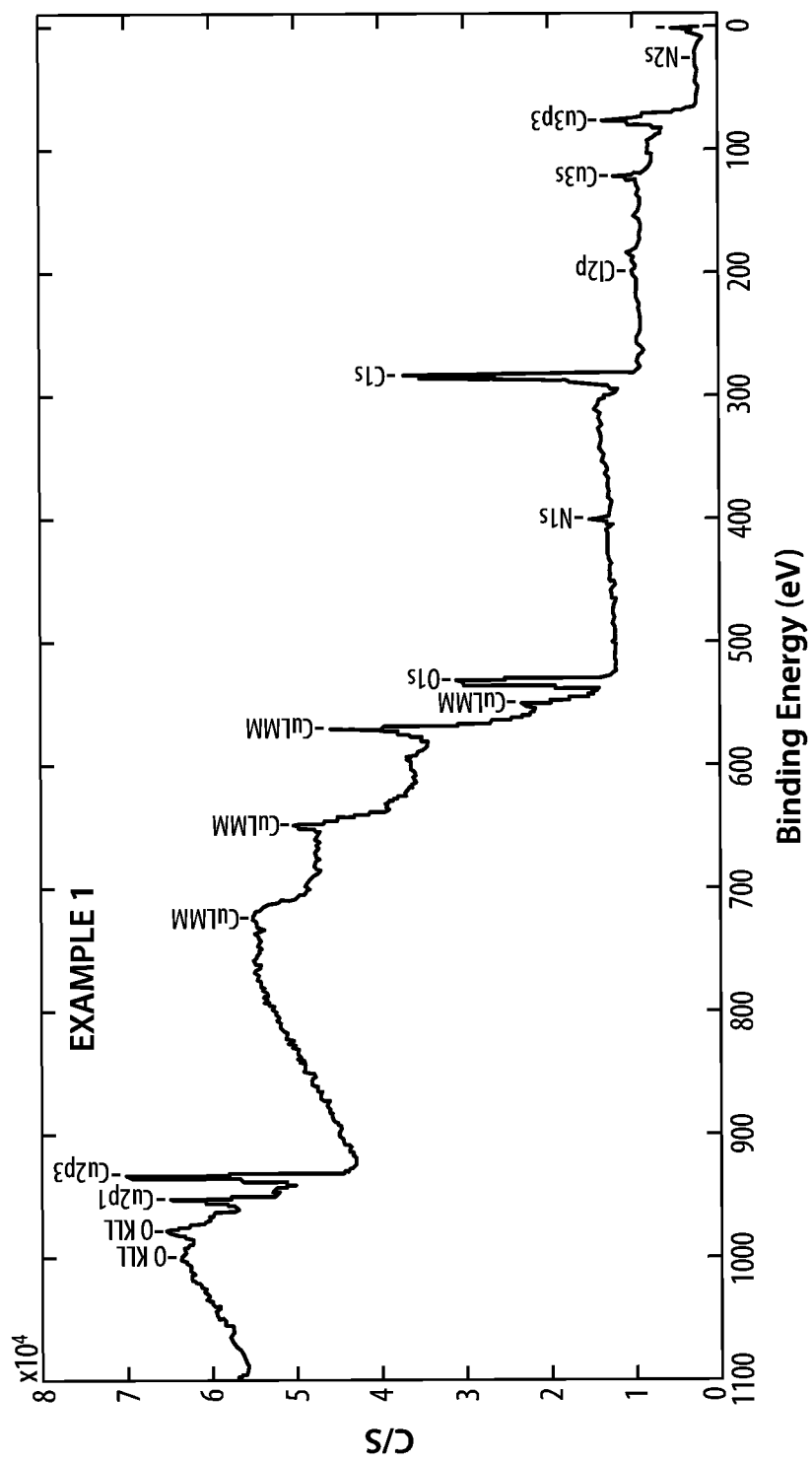
Figures 2, 3:
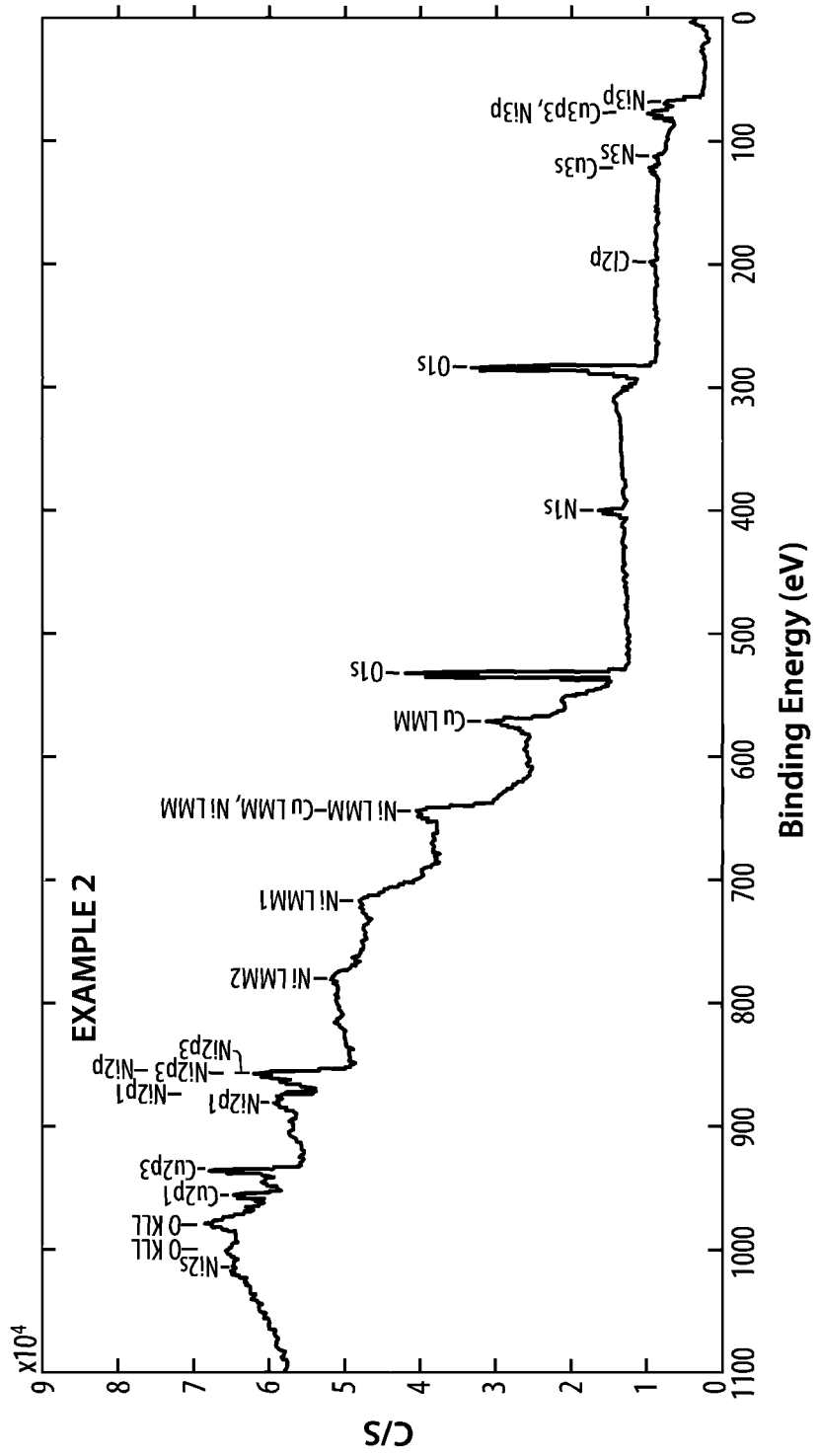
Figure 3:
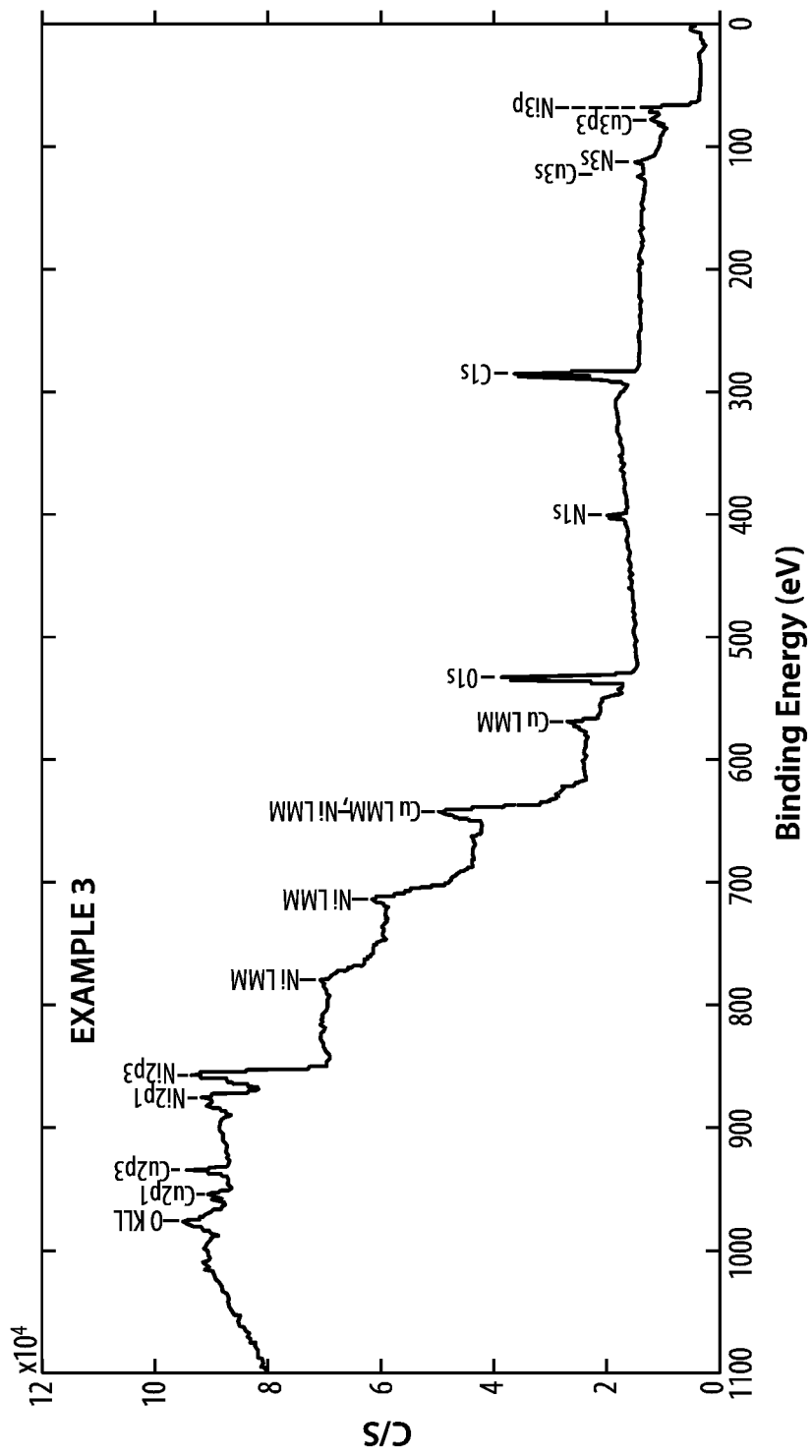
Figures 3, 4:
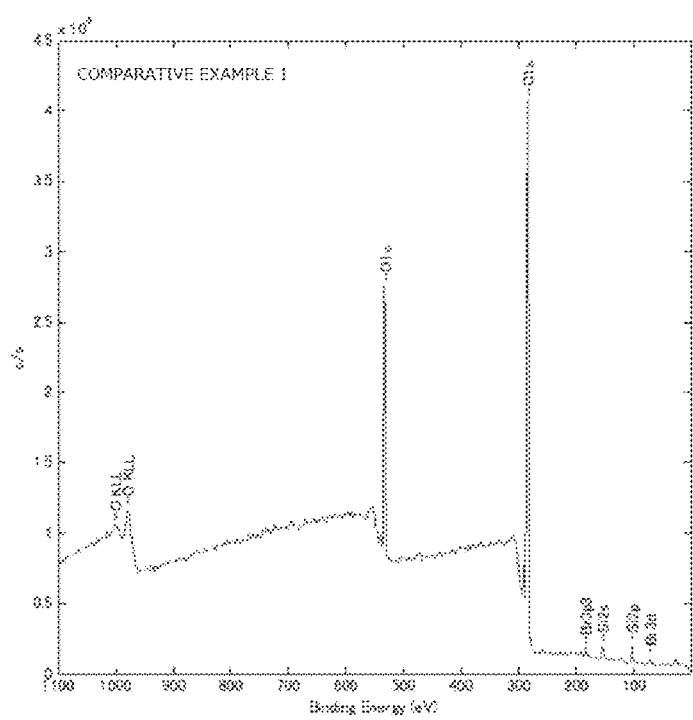
Figures 3, 4, 5:
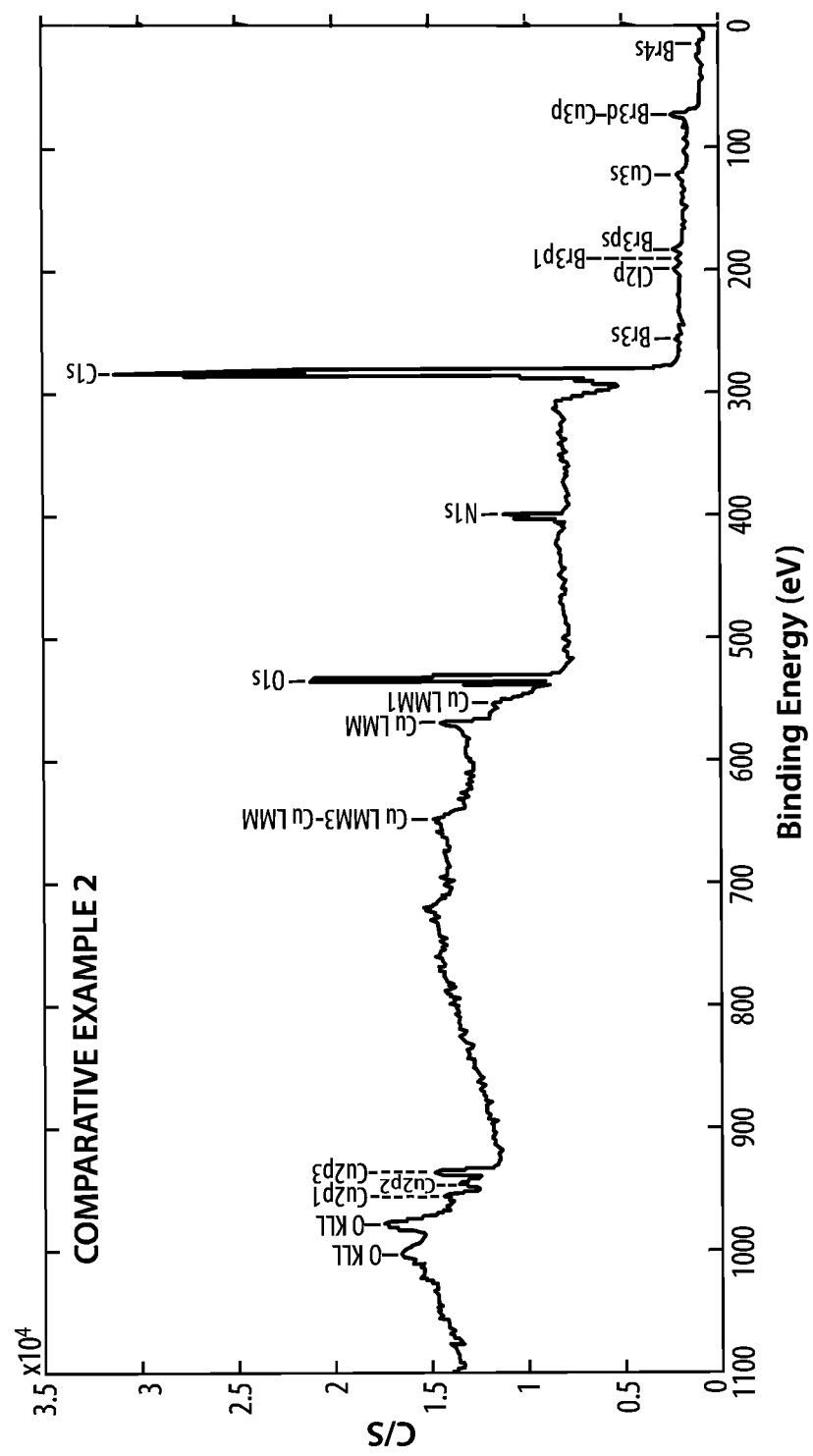
Figures 3, 4, 5, 6:
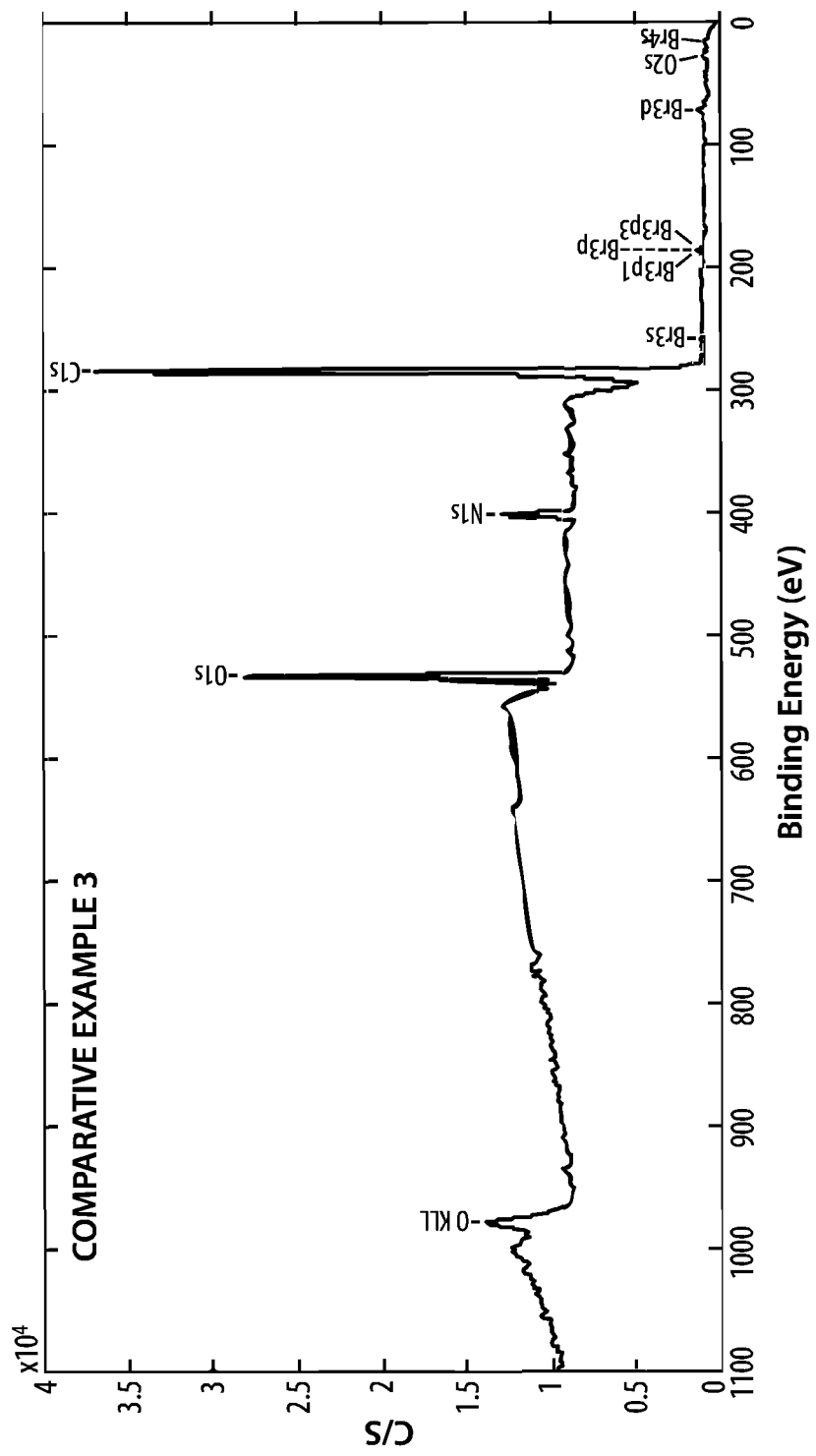
Figures 3, 4, 5, 6, 7:
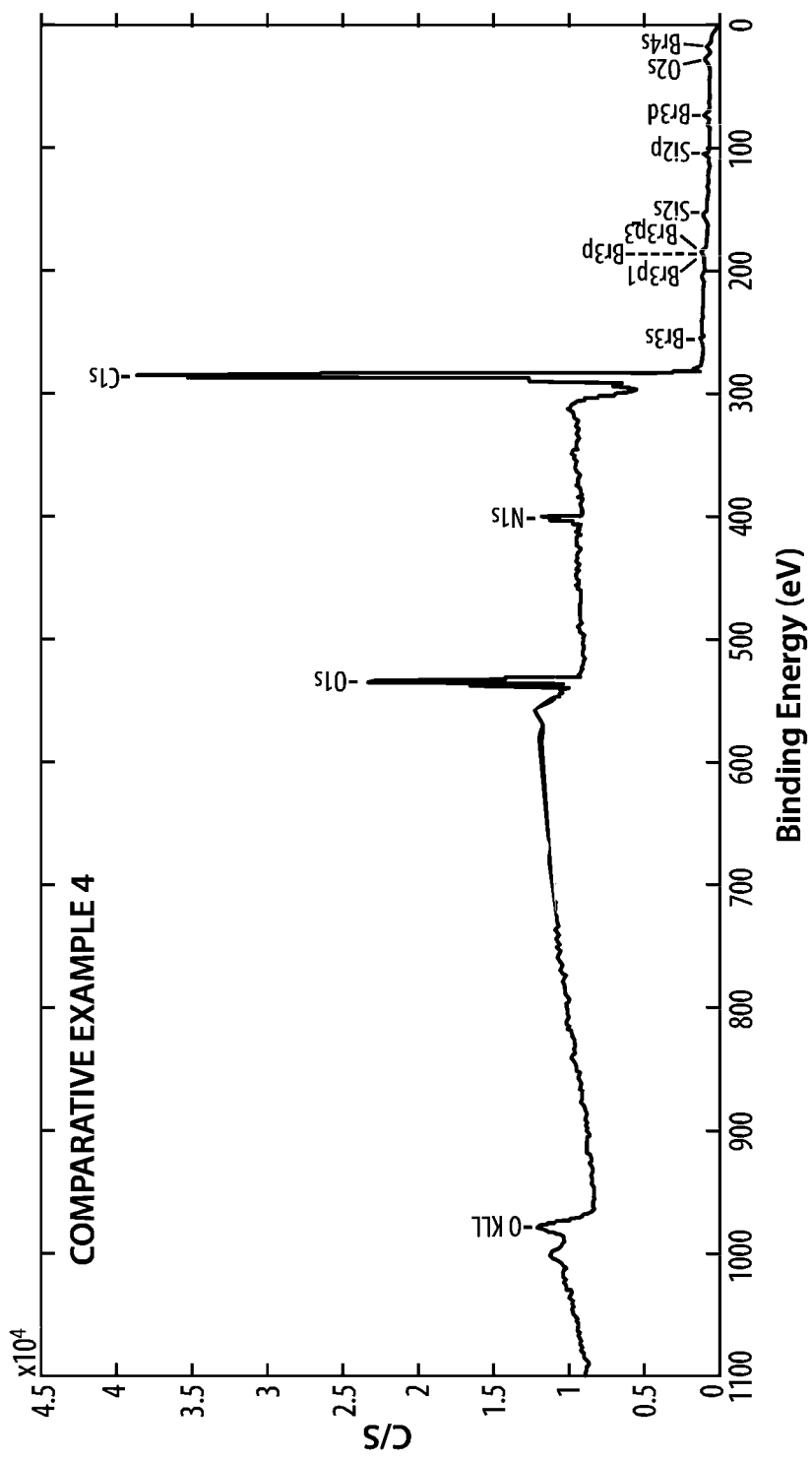
Figures 1, 4:
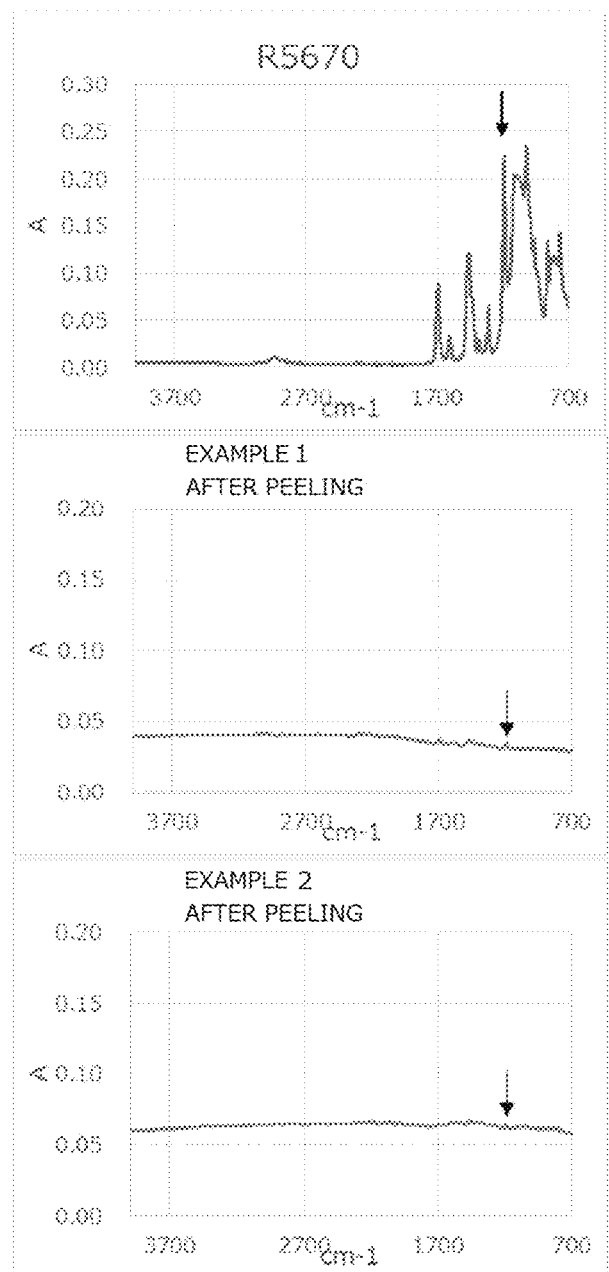
Figures 2, 4:
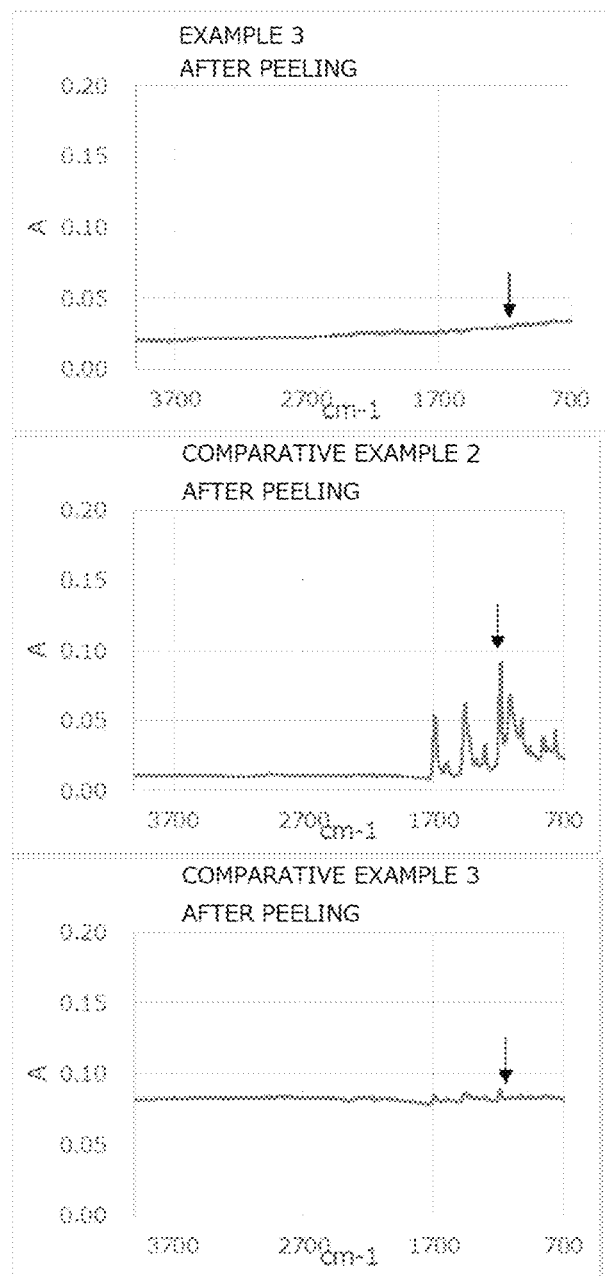
Figures 3, 4:
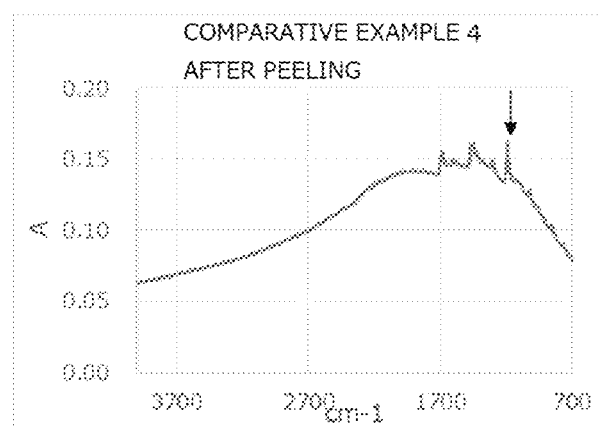
Figure 5:
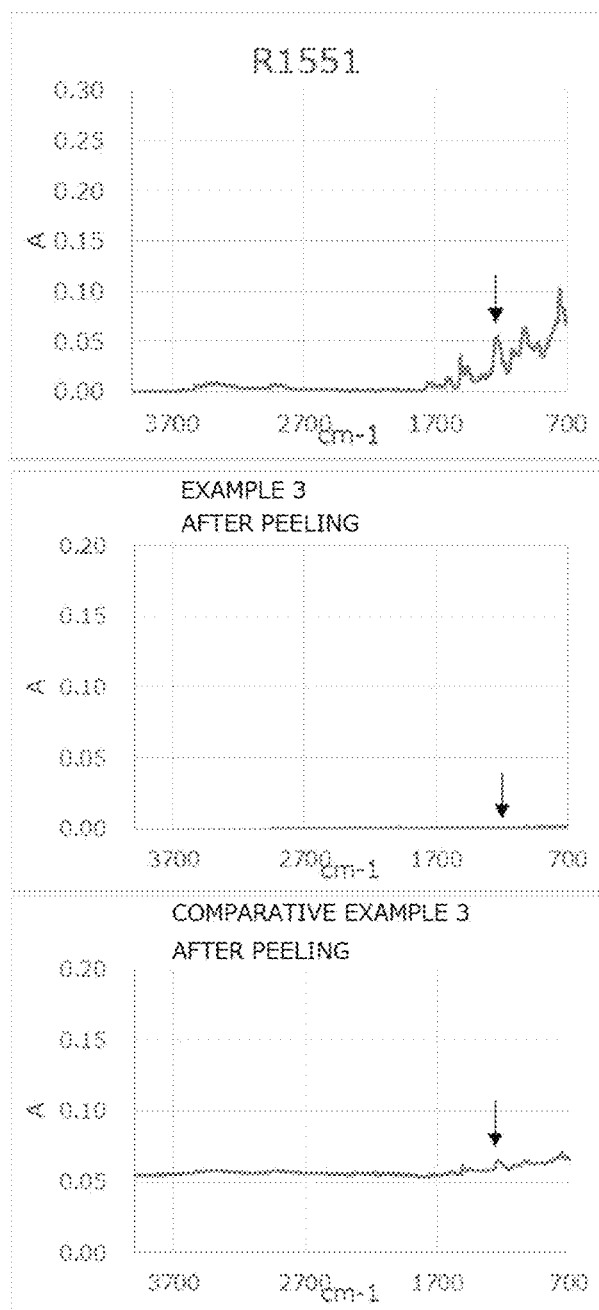
Figures 1, 6:
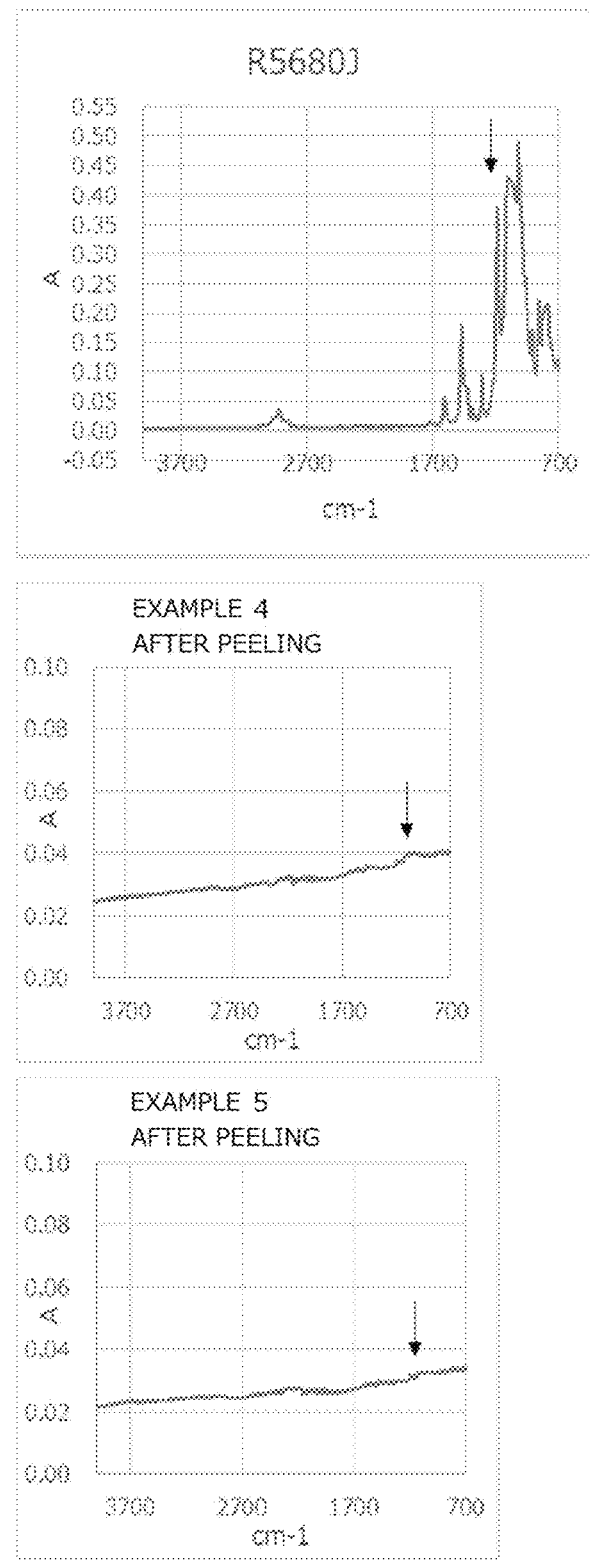
Figures 2, 6:
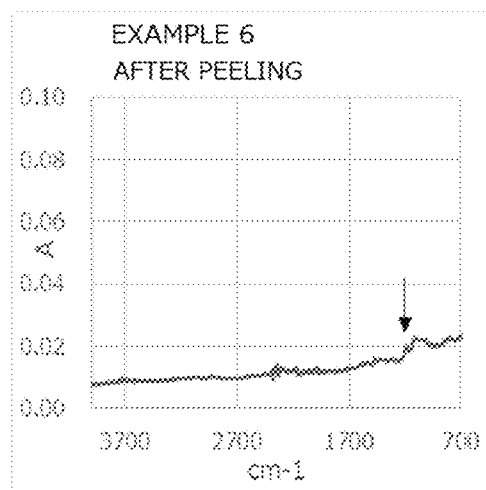
Figure 7:
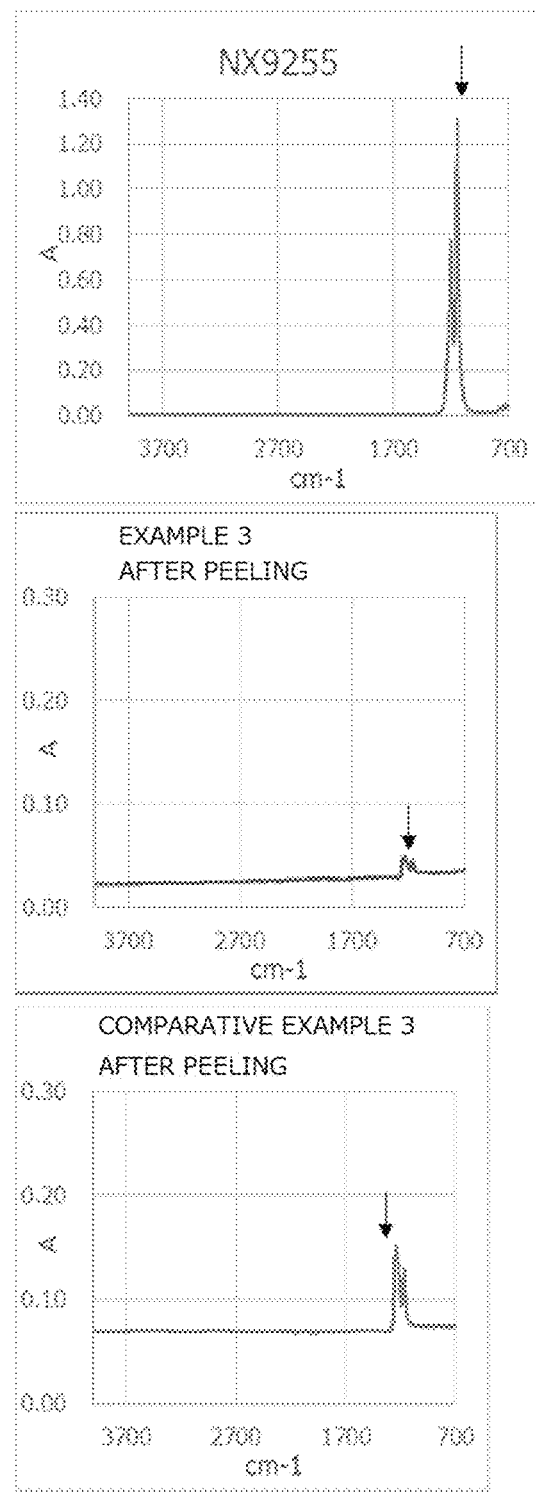
Figure 8:
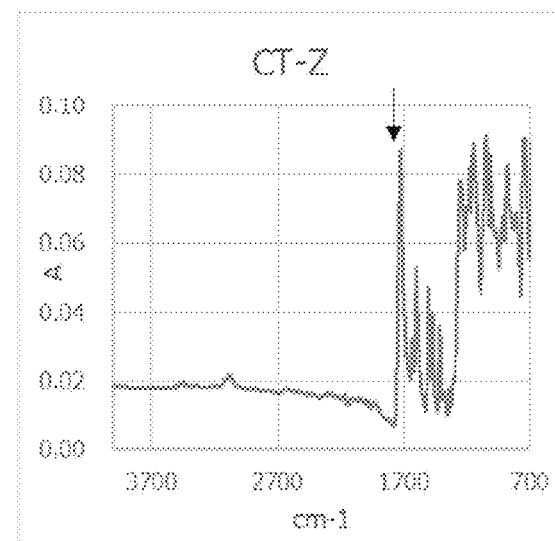
FIG. 8 shows results of ATR FT-IR measurement of surfaces of composite copper foils in the Example 3 and the Comparative Example 3 obtained after the copper foils were bonded to a resin substrate (CT-Z) by thermocompression and peeled off from there.
Figure 8:
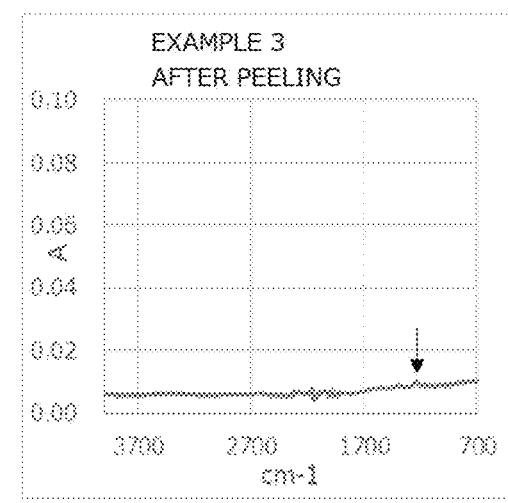
Figure 8:
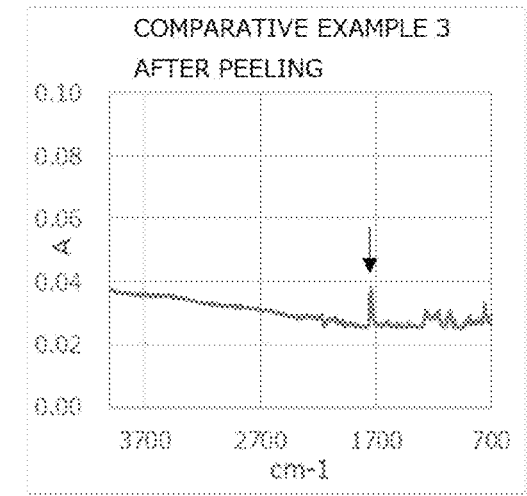

The results are shown in Table 2 and FIG. 3.

In the Examples, the peak intensity of the Cu2p3 in the spectrum derived from the transferred copper atoms is larger than that of the C1s in the spectrum caused by the resin substrate, whereas in the Comparative Examples the peak of the Cu2p3 in the spectrum was not detected or its intensity was smaller than that of the C1s in the spectrum. This shows that in the Comparative Examples, copper atoms are hardly transferred to the resin substrate or exist in the surface layer of the resin substrate where XPS can detect them.

In the Example 1, since the composite copper foil was not plated, only the Cu atoms were transferred and detected on the resin substrate side. In the Examples 2 and 3, since the composite copper foil was plated with Ni, both Cu and Ni atoms were transferred and detected on the resin side.

The ratio of C1s was smaller in all Examples compared to the Comparative Examples. It is considered that the percentage of C1s on the surface was relatively smaller in the Examples owing to the transfer of copper oxide or cuprous oxide.

TABLE 2

| | | Unit | Examples | | | | | | | | Comparative Examples | | | |
|---|---|---|---|---|---|---|---|---|---|---|---|---|---|---|
| | | | 1 | 2 | 3 | 4 | 5 | 6 | 7 | 8 | 1 | 2 | 3 | 4 |
| % Comp. | C1s | atm % | 69.3 | 57.75 | 57.94 | 50.46 | 81.19 | 55.75 | 67.32 | 50.68 | 81.58 | 79.89 | 77.94 | 81.39 |
| | N1s | atm % | 3.62 | 3.76 | 4.21 | 0 | 1.32 | 0 | 4.76 | 3.9 | 0 | 4.64 | 5.13 | 3.69 |
| | O1s | atm % | 20.74 | 29.35 | 26.42 | 34.29 | 14.37 | 29.03 | 19.97 | 28.11 | 16.53 | 15.15 | 16.74 | 14.38 |
| | Si2p | atm % | 0 | 0 | 0 | 0 | 0 | 0 | 0 | 0 | 1.69 | 0 | 0 | 0.42 |
| | Cl2p | atm % | 0 | 0 | 0 | 0.91 | 0.23 | 2.52 | 1.73 | 2.05 | 0 | 0 | 0 | 0 |
| | Br3p | atm % | 0 | 0 | 0 | 0 | 0 | 0 | 0 | 0 | 0.2 | 0.32 | 0.19 | 0.13 |
| | Sn3d5 | atm % | 0 | 0 | 0 | 4.34 | 0 | 0 | 0 | 0 | 0 | 0 | 0 | 0 |
| | Ni2p | atm % | 0 | 4.33 | 8.41 | 5.68 | 0.67 | 4.18 | 0 | 0 | 0 | 0 | 0 | 0 |
| | Cu2p3 | atm % | 6.34 | 4.81 | 3.03 | 4.32 | 2.22 | 8.51 | 6.22 | 15.27 | 0 | 0 | 0 | 0 |
| (total metal atoms)/C1s | | | 0.091 | 0.158 | 0.197 | 0.284 | 0.036 | 0.228 | 0.092 | 0.301 | 0 | 0 | 0 | 0 |

<4. Measurement of Ra and Surface Area of Composite Copper Foils Before Thermocompression Bonding and After Peeling>

(1) Method

Surface areas of the composite copper foil specimens of the Examples 1-8 and the Comparative Examples 2-4 were calculated before thermocompression bonding and after peeling using a confocal scanning electron microscopy OPTELICS H1200 (manufactured by Lasertec Corp.). Measurement conditions used were as follows: using a blue light source, in the confocal mode with a scan area of 100 μm×100 μm and a cutoff of ⅕. The objective and contact lenses were 100× and 14× magnifications, respectively, with a ×1 digital zoom factor and a z-pitch of 10 nm. the data was acquired at three locations. Each surface area was taken as the average of the three locations. Values were collected at three points, and the surface areas were average values from the three points.

(2) Results

As shown in Table 3, before the thermocompression bonding and after peeling, the values of Ra and the surface area decreased in each Example, whereas they conversely increased in the Comparative Examples. This shows that in the Examples, all or a part of the protrusions of the composite copper component were transferred to the resin side, whereas the Comparative Examples are vice versa: a part of the resin was transferred to the composite copper component.

TABLE 3

| | Unit | Examples | | | | | |
|---|---|---|---|---|---|---|---|
| | | 1 | 2 | 3 | 4 | 5 | 6 |
| Roughness Ra before thermocompression bonding | μm | 0.18 | 0.21 | 0.04 | 0.06 | 0.05 | 0.05 |
| Roughness Ra after peeling | μm | 0.12 | 0.12 | 0.03 | 0.04 | 0.04 | 0.04 |
| Percent change of roughness (after peeling/before compression bonding) | % | 64.48 | 59.42 | 94.29 | 67.80 | 95.56 | 82.61 |
| Surface area S before thermocompression bonding | μm2 | 21453 | 21578 | 10897 | 12185 | 11109 | 11132 |
| Surface area S after peeling | μm2 | 15573 | 16157 | 10642 | 10960 | 11062 | 10855 |
| Percent change of surface area (after peeling/before compression bonding) | % | 72.59 | 74.88 | 97.66 | 89.95 | 99.58 | 97.52 |

| | Unit | Examples | | Comparative Examples | | |
|---|---|---|---|---|---|---|
| | | 7 | 8 | 2 | 3 | 4 |
| Roughness Ra before thermocompression bonding | μm | 0.23 | 0.19 | 0.03 | 0.04 | 0.18 |
| Roughness Ra after peeling | μm | 0.05 | 0.13 | 0.19 | 0.05 | 0.21 |
| Percent change of roughness (after peeling/before compression bonding) | % | 21.46 | 68.95 | 584.85 | 130.56 | 117.71 |
| Surface area S before thermocompression bonding | μm2 | 23636 | 21709 | 10809 | 10915 | 19033 |
| Surface area S after peeling | μm2 | 11421 | 16718 | 17411 | 11599 | 21839 |
| Percent change of surface area (after peeling/before compression bonding) | % | 48.32 | 77.01 | 161.08 | 106.27 | 114.74 |

<5. Calculation of $\Delta E^*_{ab}$ of Composite Copper Foils Before Thermocompression Bonding and After Peeling>

(1) Method

Color differences (L*, a*, b*) between the surfaces of the copper foil of each composite copper component specimen before thermocompression bonding and after peeling were measured, and $\Delta E^*_{ab}$ was calculated from the obtained values according to the following equation:

$$\Delta E^*_{ab} = [(\Delta L^*)^2 + (\Delta a^*)^2 + (\Delta b^*)^2]^{1/2}$$

(2) Results

As shown in Table 4, before thermocompression bonding and after peeling, $\Delta E^*_{ab}$ was 15 or more in the Examples, whereas it was less than 15 in the Comparative Examples. This is because, in the Examples, the metal contained in the copper oxide-containing layer is transferred to the resin substrate, resulting in a larger color change of the copper component: in contrast, in the Comparative Examples, the copper oxide-containing layer remains on the copper component, resulting in a smaller color change of the copper component. That is to say, the more metal in the copper oxide-containing layer is transferred, the larger the difference between them becomes. In fact, in the photographs shown in FIG. 2, the resin side of the Examples is heavily colored after peeling, while the resin side of the Comparative Examples remains almost white.

TABLE 4

| | | Examples | | | | | | | | Comparative Examples | | |
|---|---|---|---|---|---|---|---|---|---|---|---|---|
| | | 1 | 2 | 3 | 4 | 5 | 6 | 7 | 8 | 2 | 3 | 4 |
| Before compression bonding | L* | 14.03 | 15.39 | 9.24 | 14.24 | 10.54 | 13.78 | 14.49 | 12.70 | 28.05 | 8.90 | 52.79 |
| | a* | −1.33 | 0.79 | 0.25 | −0.25 | 0.38 | 0.07 | 2.34 | −0.35 | 10.77 | 0.22 | 18.44 |
| | b* | 3.11 | 0.53 | 1.25 | −2.40 | 0.38 | 0.58 | 7.08 | −0.56 | 22.48 | 1.47 | 16.57 |
| After peeling | L* | 47.18 | 40.41 | 41.06 | 33.88 | 37.02 | 33.18 | 50.76 | 39.31 | 37.35 | 17.12 | 44.87 |
| | a* | 8.86 | 9.07 | 4.94 | 7.12 | 7.72 | 7.60 | 12.15 | 4.45 | 11.89 | 7.53 | 13.81 |
| | b* | 15.60 | 12.05 | 9.62 | 4.91 | −1.35 | 0.50 | 11.79 | 9.79 | 16.11 | −3.81 | 12.81 |
| Color change | ΔL | −33.15 | −25.02 | −31.82 | −19.64 | −26.48 | −19.40 | −36.27 | −26.61 | −9.30 | −8.22 | 7.92 |
| | Δa | −10.19 | −8.28 | −4.69 | −7.37 | −7.34 | −7.53 | −9.81 | −4.80 | −1.12 | −7.31 | 4.63 |
| | Δb | −12.69 | −11.52 | −8.37 | −7.31 | 1.73 | 0.08 | −4.71 | −10.35 | 6.37 | 5.28 | 3.76 |
| | $\Delta E^*_{ab}$ | 36.90 | 28.80 | 33.20 | 22.21 | 27.53 | 20.81 | 37.87 | 28.95 | 11.33 | 12.20 | 9.91 |

<6. Analysis of Composite Copper Foil Surfaces After Transfer by Attenuated Total Reflection Fourier Transform Infrared Spectroscopy (ATR FT-IR)>

(1) Method

As the resin substrates, R1551GG (epoxy-based), R5670KJ and R5680J (PPE-based), NX9255 (PTFE-based), and CT-Z (LCP-based) were used for thermocompression bonding, and composite copper component specimens after peeling were analyzed using ATR FT-IR under the following measurement conditions.

Measurement Conditions:

Parkin Elmer's Spectrum 100

Atr Method:
Crystal: germanium
Spectral resolution: 4
Scan rate: 4 scans
Pressure (force gauge): 40±5 [N]
Spectrum: absorbance units (2) Calculation of S/N ratio After heating and pressurizing only the resin substrate under the same conditions as those used for thermocompression bonding to the composite copper component, the resin substrate was subjected to FT-IR measurement. An arbitrary wavelength without resin-derived peaks was selected in the range of 50 cm$^{-1}$. In this example, the wavelength range of 3800-3850 cm$^{-1}$ was selected as the wavelength with no peak derived from the resin. Furthermore, in the wavelength range of 700-4000 cm$^{-1}$, the wavelength at which the maximum peak was detected was identified. The maximum peak was detected around 1200 cm$^{-1}$ when R1551GG was used as the resin substrate; likewise, around 1190 cm$^{-1}$ for R5670KJ and R5680KJ, around 1232 cm$^{-1}$ for NX9255, and around 1741 cm$^{-1}$ for CT-Z (arrowheads in FIGS. 4-8 represent the detected maximum peak wavelengths).

The surfaces of the copper components after the transfer were measured using FT-IR, and a baseline was drawn by connecting the extreme points of both ends of the peak at the maximum peak detection wavelength with a straight line. The difference between the baseline and the maximum height of the peak was used as the signal value (S). The difference between the maximum and minimum values of the peak detected at a wavelength of 3800-3850 cm$^{-1}$ was used as the noise value (N), and the S/N ratio was calculated.

(3) Results

The results are shown in FIGS. 4-8 and Table 5.

TABLE 5

| R1551GG | Ex. 3 | Comp. Ex. 3 |
|---|---|---|
| N noise width | 0.00068 | 0.0006 |
| S signal height | 0.0003 | 0.0069 |
| S/N ratio | 0.4 | 11.5 |

| | Examples | | | | | Comparative Examples | | |
|---|---|---|---|---|---|---|---|---|
| R5670KJ | 1 | 2 | 3 | 7 | 8 | 2 | 3 | 4 |
| N noise width | 0.0007 | 0.0004 | 0.0006 | 0.0004 | 0.0004 | 0.0003 | 0.0007 | 0.0011 |
| S signal height | 0.0049 | 0.0026 | 0.0015 | 0.0002 | 0.0002 | 0.0650 | 0.0076 | 0.0281 |
| S/N ratio | 7 | 6.5 | 2.5 | 0.4 | 0.4 | 216.7 | 10.9 | 25.5 |

| | Examples | | |
|---|---|---|---|
| R5680KJ | 2 | 3 | 4 |
| N noise width | 0.0005 | 0.0007 | 0.0007 |
| S signal height | 0.0013 | 0.0010 | 0.0069 |
| S/N ratio | 2.6 | 1.4 | 9.8 |

| NX9255 | Ex. 3 | Comp. Ex. 3 |
|---|---|---|
| N noise width | 0.000535 | 0.000535 |
| S signal height | 0.0052 | 0.0576 |
| S/N ratio | 9.7 | 107.7 |

| CT-Z | Ex. 3 | Comp. Ex. 3 |
|---|---|---|
| N noise width | 0.00035 | 0.00035 |
| S signal height | 0.0004 | 0.0125 |
| S/N ratio | 1.1 | 35.7 |

As shown in Table 5, in the Examples, no peak with S/N ratios of 10 or higher corresponding to resin-derived organic matter was detected on the composite copper foil side. In contrast, in the Comparative Examples, peaks with S/N ratios of 10 or higher corresponding to resin-derived organic matter were detected on the composite copper foil side.

This is because, in the Comparative Examples, the metal on the surface of the composite copper component was hardly transferred, and the cohesive destruction of the resin occurred when the composite copper component was peeled off from the resin substrate, and the destroyed resin adhered to the surface of the composite copper component, so the peak corresponding to the organic matter derived from the resin was detected. In the Examples, however, since the metal on the surface of the composite copper component was transferred to the resin substrate, there was almost no adhesion of the resin to the composite copper component after it was peeled off from the resin substrate, and no peak with S/N ratios of 10 or higher corresponding to resin-derived organic matter was detected.

In other words, the metal on the surface of the composite copper component is not transferred and cohesive destruction of the resin occurs because the protrusions formed with the copper oxide-containing layer are stronger than the resin substrate in the Comparative Examples. In contrast, the metal on the surface of the composite copper component is transferred and the resin hardly adheres because the protrusions formed with the copper oxide-containing layer are weaker than the resin substrate in the Examples.

INDUSTRIAL APPLICABILITY

Figure 9:
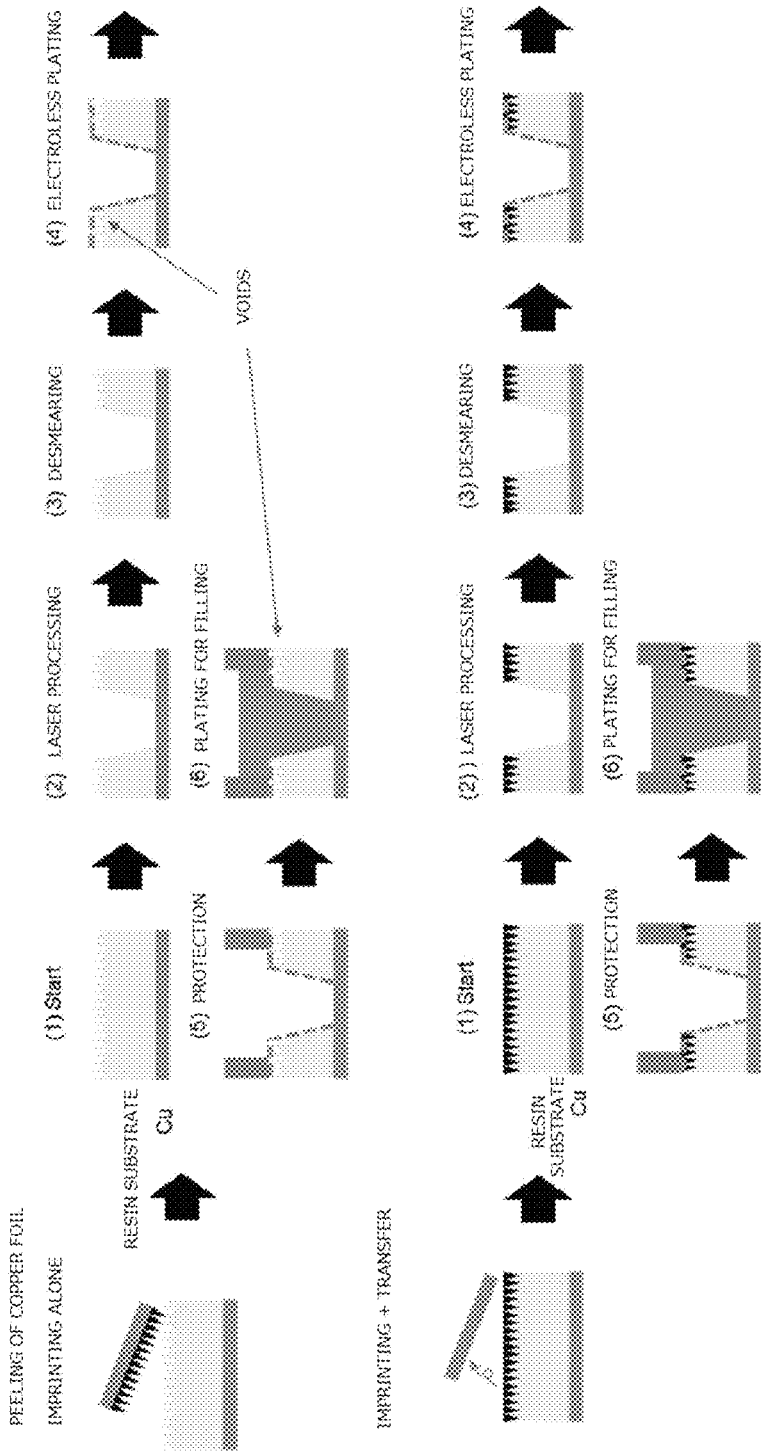
FIG. 9 shows schematic diagrams illustrating how a composite copper foil in one embodiment of the present invention ("imprint+transfer") and a conventional copper foil for imprint ("imprint only") are applied to SAP.

The present invention provides a novel composite copper component. Such composite copper components are suitable for SAP and MSAP (FIG. 9). To allow a plating solution to enter the deepest part of the troughs, the shape of the troughs needs to be somewhat large, which was not suitable for the formation of fine wiring. However, when the composite copper foils of the present invention are used, the copper oxide-containing layer that forms the textured surface is transferred. Thus, there is no need for the plating solution to enter the deepest part of the troughs, and (pattern) copper plating can be performed on the layer having the transferred copper oxide without irregularities. Even if the troughs in the surface of the original composite copper component is long and thin, voids are less likely produced between the resin substrate and the (pattern) copper plated layer, which is suitable for the formation of fine wiring.

Moreover, since the copper oxide-containing layer is plated with copper, the resulting copper plating has a high bonding affinity to the copper oxide-containing layer, and the peel strength between the resin substrate and the (patterned) copper plating layer is ensured by the adhesion of the copper oxide-containing layer bonded to the copper plating layer.

The invention claimed is:

1. A composite copper component comprising a copper oxide-containing layer formed on at least a portion of the surface of a copper component, wherein
when the surface of the composite copper component is bonded to a resin substrate by thermocompression under given conditions, and the copper component is peeled off from the resin substrate under given conditions after the thermocompression bonding, a metal atom contained in the copper oxide-containing layer is detected from a surface of the resin substrate from which the copper component has been peeled off in an X-ray photoelectron spectrum obtained by an X-ray photoelectron spectroscopy (XPS) analysis with a survey spectrum, and
wherein a sum of intensities of main peaks of metal elements detected from the surface of the resin substrate from which the copper component has been peeled off is greater than a peak intensity of C1s.

2. The composite copper component according to claim 1, wherein [a sum of percentages of metal elements in surface atomic composition (atom %)] divided by [a percentage of C1s in surface atomic composition (atom %)], calculated from a result of XPS measurement, on the surface of the resin substrate from which the copper component has been peeled off, is 0.040 or more.

3. The composite copper component according to claim 2, wherein [a sum of percentages of metal elements in surface atomic composition (atom %)] divided by [a percentage of C1s in surface atomic composition (atom %)], calculated from a result of XPS measurement, on the surface of the resin substrate from which the copper component has been peeled off, is 0.010 or more.

4. The composite copper component according to claim 3, wherein a sum of percentages of Cu2p3 and Ni2p3 in surface atomic composition is 3.0 atom % or more when an XPS analysis with a survey spectrum is performed on the surface of the resin substrate from which the copper component has been peeled off, and percentages of detected elements are calculated.

5. The composite copper component according to claim 3, wherein a sum of percentages of Cu2p3 and Ni2p3 in surface atomic composition is 1.5 atom % or more when an XPS analysis with a survey spectrum is performed on the surface of the resin substrate from which the copper component has been peeled off, and percentages of detected elements are calculated.

6. The composite copper component according to claim 1, wherein a percentage of Cu2p3 in surface atomic composition is 2.8 atom % or more when an XPS analysis with a survey spectrum is performed on the surface of the resin substrate from which the copper component has been peeled off, and percentages of detected elements are calculated.

7. The composite copper component according to claim 1, wherein a percentage of Cu2p3 in surface atomic composition is 1.0 atom % or more when an XPS analysis with a survey spectrum is performed on the surface of the resin substrate from which the copper component has been peeled off, and percentages of detected elements are calculated.

8. The composite copper component according to claim 1, wherein the surface of the composite copper component with the copper oxide-containing layer formed thereon has an arithmetic mean roughness (Ra) of 0.04 μm or more, and a percentage of Ra of the surface of the copper component peeled off from the resin substrate to the Ra of the surface of the composite copper component is less than 100%.

9. The composite copper component according to claim 1, wherein a percentage of a surface area of the copper component peeled off from the resin substrate to a surface area of the surface of the composite copper component with the copper oxide-containing layer formed thereon is less than 100%.

10. The composite copper component according to claim 1, wherein a color difference (ΔE*ab) between the surface of the composite copper component with the copper oxide-containing layer formed thereon and the surface of the copper component peeled off from the resin substrate is 15 or more.

11. The composite copper component according to claim 1, wherein the resin substrate contains at least one insulating resin selected from the group consisting of polyphenylene ethers (PPEs), epoxy resins, polyphenylene oxides (PPOs), polybenzoxazoles (PBOs), polytetrafluoroethylenes (PTFEs), liquid crystal polymers (LCPs), or triphenylphosphites (TPPIs), fluoropolymers, polyetherimides, polyetheretherketones, polycycloolefins, bismaleimide resins, low dielectric constant polyimides, and cyanate resins.

12. The composite copper component according to claim 1, wherein given conditions for the thermocompression bonding are at a temperature from 50 to 400° C., at a pressure from 0 to 20 MPa, and for a time from 1 minute to 5 hours.

13. The composite copper component according to claim 1, wherein the copper oxide-containing layer contains metal other than copper.

14. The composite copper component according to claim 13, wherein the metal other than copper is nickel.

15. A method of manufacturing a printed wiring board using a composite copper component according to claim 1, the method comprising the steps of:
1) bonding a resin substrate to a copper oxide-containing layer of the composite copper component under given conditions by thermocompression;
2) peeling off the copper component from the resin substrate under given conditions to obtain a resin substrate having a part or all of metal constituting the copper oxide-containing layer; and
3) Plating copper on the surface of the resin substrate having the part or all of metal constituting the copper oxide-containing layer.

* * * * *